US010168194B2

(12) United States Patent
Vohra et al.

(10) Patent No.: US 10,168,194 B2
(45) Date of Patent: Jan. 1, 2019

(54) METHOD AND APPARATUS FOR DRIVING A MULTI-OSCILLATOR SYSTEM

(71) Applicant: Analog Devices, Inc., Norwood, MA (US)

(72) Inventors: Gaurav Vohra, Sudbury, MA (US); William A. Clark, Winchester, MA (US); Mehrnaz Motiee, Boston, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/998,168

(22) Filed: Dec. 24, 2015

(65) Prior Publication Data

US 2017/0184644 A1 Jun. 29, 2017

(51) Int. Cl.
| | |
|---|---|
| *G01D 21/00* | (2006.01) |
| *H03L 7/00* | (2006.01) |
| *H03L 7/14* | (2006.01) |
| *H03L 7/18* | (2006.01) |
| *G01D 18/00* | (2006.01) |

(52) U.S. Cl.
CPC .............. *G01D 21/00* (2013.01); *H03L 7/00* (2013.01); *H03L 7/141* (2013.01); *H03L 7/18* (2013.01); *G01D 18/00* (2013.01)

(58) Field of Classification Search
CPC ........................... G01R 23/02; G01R 31/2824
USPC ................................ 324/76.31, 76.11, 76.41
See application file for complete search history.

(56) References Cited

U.S. PATENT DOCUMENTS

| | | | |
|---|---|---|---|
| 3,151,487 A | 10/1964 | Schuck | |
| 3,282,117 A | 11/1966 | Sporn et al. | |
| 4,258,572 A | 3/1981 | Loper | |
| 4,814,680 A | 3/1989 | Hulsing | |
| 5,461,918 A | 10/1995 | Mozurkewich | |
| 5,531,115 A | 7/1996 | Erdley | |
| 5,832,657 A * | 11/1998 | Jan ..................... | A01M 31/002 116/22 A |
| 6,041,642 A | 3/2000 | Duncan | |

(Continued)

FOREIGN PATENT DOCUMENTS

WO    WO 89/10567    11/1989

OTHER PUBLICATIONS

Abramovitch, "Phase-Locked Loops: A Control Centric Tutorial," Proceedings of the American Control Conference, 15 pages, May 8-10, 2002.
Adler, "A Study of Locking Phenomena in Oscillators," Proceedings of the I.R.E. and Waves and Electrons, pp. 351-357, Jun. 1946.
Analog Devices, Inc., "Fundamentals of Phase Locked Loops (PLLs)," Analog Devices, MT-086 Tutorial, 10 pages, 2009.

(Continued)

*Primary Examiner* — Giovanni Astacio-Oquendo
(74) *Attorney, Agent, or Firm* — Wolf, Greenfield & Sacks, P.C.

(57) ABSTRACT

Various embodiments mitigate the risk of frequency-lock in systems having multiple resonators by dynamically changing the frequency at which at least one of the resonators is driven. More particularly, the drive frequency of at least one of the resonators is changed often enough that the multiple resonators do not have time to achieve frequency lock. Changes in the oscillation of the resonators may be analyzed to determine, for example, acceleration of such systems. Some embodiments implement self-test by assessing expected performance of a system with toggling drive frequencies. More particularly, some embodiments implement self-test by artificially inducing displacement of a movable member of a system.

33 Claims, 15 Drawing Sheets

(56) References Cited

U.S. PATENT DOCUMENTS

| | | | |
|---|---|---|---|
| 6,094,102 | A | 7/2000 | Chang et al. |
| 6,249,189 | B1 | 6/2001 | Wu et al. |
| 6,285,219 | B1 | 9/2001 | Pauls |
| 6,585,338 | B2 | 7/2003 | Harris |
| 7,042,213 | B2 | 5/2006 | Greywall |
| 7,173,495 | B1 | 2/2007 | Kenny et al. |
| 7,333,528 | B1 * | 2/2008 | Miao ............... H04B 1/7163 375/130 |
| 7,570,125 | B2 | 8/2009 | Ostanin et al. |
| 8,624,679 | B2 | 1/2014 | Dikshit et al. |
| 2002/0061528 | A1 * | 5/2002 | Gardner ............ C12N 15/63 435/6.11 |
| 2005/0280879 | A1 | 12/2005 | Gibson et al. |
| 2006/0034403 | A1 | 2/2006 | Huang et al. |
| 2007/0188253 | A1 | 8/2007 | Sutardja |
| 2009/0267837 | A1 | 10/2009 | Lin |
| 2011/0273720 | A1 * | 11/2011 | Schwartz ........... G01C 19/667 356/467 |
| 2015/0068391 | A1 * | 3/2015 | Friesen ............. G10H 1/06 84/701 |
| 2016/0186209 | A1 * | 6/2016 | Liu ................. G01N 33/5044 435/7.21 |
| 2017/0060150 | A1 * | 3/2017 | Stefanski ........... G05D 23/27 |
| 2018/0036740 | A1 * | 2/2018 | Nelson .............. B02C 19/18 |
| 2018/0059176 | A1 * | 3/2018 | Ding ................ G01R 1/0433 |

OTHER PUBLICATIONS

Hogenauer, "An Economical Class of Digital Filters for Decimation and Interpolation," IEEE Transactions on Acoutstics, Speech, and Signal Processing, vol. ASSP-29, No. 2, pp. 155-162, Apr. 1981.

Hulsing, "MEMS Inertial Rate and Acceleration Sensor," IEEE 1998, pp. 169-176.

Kester, "Converting Oscillator Phase Noise to Time Jitter," Analog Devices, MT-008 Tutorial, 10 pages, 2009.

Seshia et al., "A Vacuum Packaged Surface Micromachined Resonant Accelerometer," IEEE Journal of Microelectromechanical Systems, vol. 11, No. 6, pp. 784-793, Dec. 2002.

Su et al., "A Resonant Accelerometer With Two-Stage Microleverage Mechanisms Fabricated by SOI-MEMS Technology," IEEE Sensors Journal, vol. 5, No. 6, pp. 1214-1223, Dec. 2005.

Sung et al., "A vibration-controlled resonant accelerometer design and its application to the single structured gyroscope/accelerometer system," IEEE, 6 pages, 2007.

Trusov et al., "Silicon Accelerometer with Differential Frequency Modulation and Continuous Self-Calibration," IEEE, MEMS 2013, Taipei, Taiwan, pp. 29-32, Jan. 20-24, 2013.

Trusov et al. "1 PPM Precision Self-Calibration of Scale Factor in MEMS Coriolis Vibratory Gyroscopes," Transducers 2013, 16-20, pp. 2531-2534, Jun. 2013.

Wu, "System Architecture for Mode-Matching a MEMS Gyroscope," Massachusetts Institute of Technology, 126 pages, 2009.

* cited by examiner

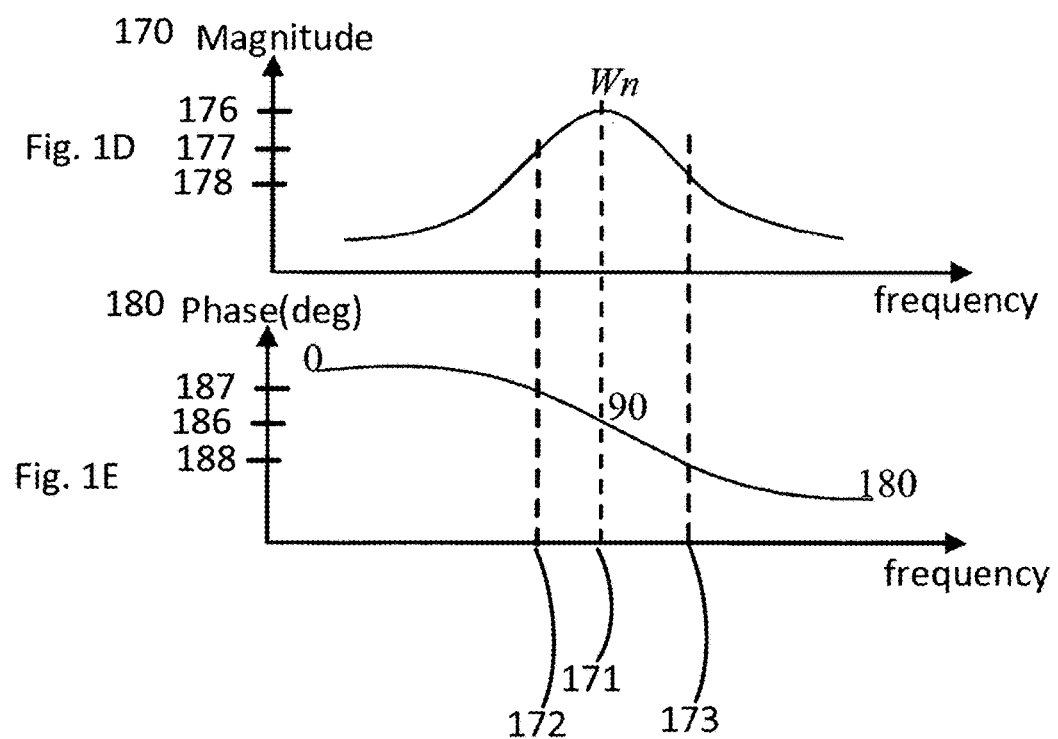

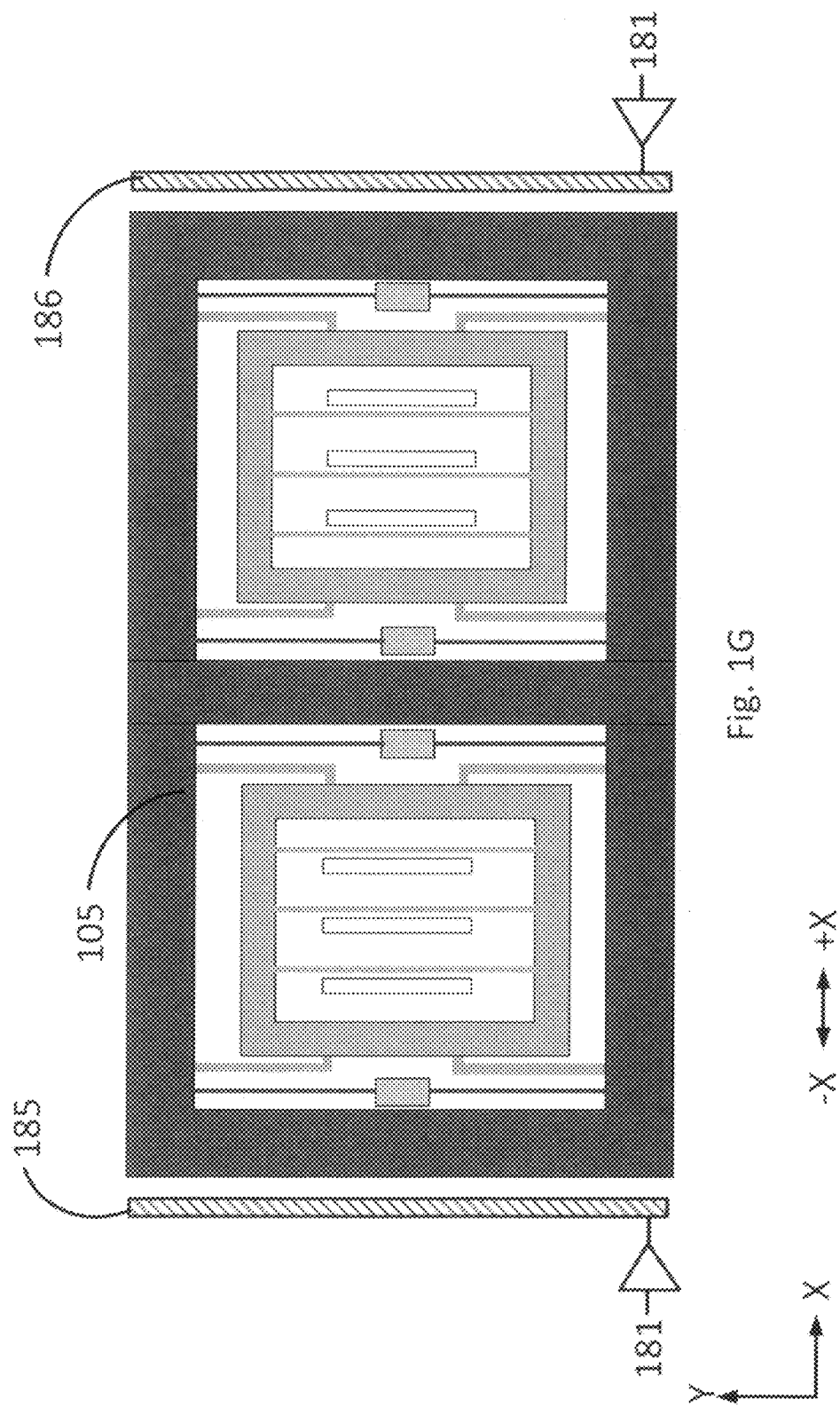

METHOD AND APPARATUS FOR DRIVING A MULTI-OSCILLATOR SYSTEM

TECHNICAL FIELD

The present invention relates to multi-oscillator systems, and more particularly to controlling multi-oscillator systems.

BACKGROUND ART

Multi-oscillator systems may be used to detect acceleration in a resonant accelerometer, or may be to detect a change in frequency due to external physical stimulus.

Frequency lock-in is one of the concerns for multi-oscillator systems, such as resonant accelerometers for example. The differential frequencies (due to change in acceleration) can lock to the natural frequency of the structure under acceleration giving a false measure of acceleration.

SUMMARY OF THE EMBODIMENTS

In accordance with one embodiment, a method of operating a sensor having a plurality of resonating members, each resonating member having a resonant frequency, includes driving a first resonating member with a first member drive signal, and toggling the first member drive signal between a first frequency and a second frequency. In some embodiments, at least one of the first frequency and the second frequency offset from the first resonating member's resonant frequency.

Some embodiments drive the first resonating member with a first phase-locked loop. Some embodiments toggle the first variable frequency drive signal between a first frequency and a second frequency by changing a phase offset introduced into a drive signal produced by the first phase-locked loop at a point between the phase-locked loop and the first resonating member. For example, in some embodiments, the first phase-locked loop includes a phase divider that produces a plurality of signals, each of the plurality of signals having a non-zero phase relative to other of the plurality of signals, and the sensor includes a multiplexer configured to controllably couple one of the plurality of signals to the first resonating member as the drive signal. In such embodiments, changing a phase offset introduced into the drive signal includes operating the multiplexer to couple a different one of the plurality of signals to the first resonating member.

The method also includes driving a second resonating member at a second member drive frequency. In some embodiments, driving the second resonating member at a second member drive frequency includes driving the second resonating member with a second variable frequency drive signal, and toggling the second variable frequency drive signal between a third frequency and a fourth frequency. In some embodiments, at least one of the third frequency and the fourth frequency offset from the second resonating member's resonant frequency. Some embodiments drive the with a second phase-locked loop, and toggle the second variable frequency drive signal between a third frequency and a fourth frequency.

In some embodiments, toggling the first variable frequency drive signal occurs synchronously with, or even simultaneously with, toggling the second variable frequency drive signal.

Sensing (e.g., sensing acceleration of an accelerometer) is then performed by assessing changes in oscillation frequencies of at least one of the first resonating member and the second resonating member.

For example, in some embodiments, assessing changes in oscillation frequencies of the first resonating member and the second resonating member includes. assessing changes in an oscillation frequency of the first resonating member relative to an oscillation frequency of the second resonating member. Such an assessment is performed, in some embodiments, by subtracting an offset value from the frequency difference between the oscillation frequency of the first resonating member and the oscillation frequency of the second resonating member.

Another embodiment is directed to a method of operating a sensor for detecting a physical quantity. The sensor has a plurality of resonating members, at least one of the plurality of resonating members having a resonant property affectable by the physical quantity to be detected. The method includes oscillating a first resonating member at a frequency determined at least in part by the resonant property of the first resonating member, and modulating the frequency of oscillation of the first resonating member other than by the physical quantity to be detected.

The method also includes oscillating a second resonating member at a frequency determined at least in part by the resonant property of the second resonating member; and detecting the physical quantity by assessing changes in the oscillation frequencies among the first and second resonating members. The act of assessing changes in the oscillation frequencies among the first and second resonating members includes, in some embodiments, assessing changes in an oscillation frequency of the first resonating member relative to an oscillation frequency of the second resonating member.

In some embodiments, the sensor includes oscillation electronics, and phase properties of the oscillation electronics are controlled to modulate the frequency of oscillation of the first resonating member. For example, the oscillation electronics may include at least a first phase-locked loop for oscillating a first resonating member, and modulating the frequency of oscillation of the first resonating member includes changing a phase offset introduced into a drive signal produced by the first phase-locked loop at a point between the phase-locked loop and the first resonating member.

In some embodiments, the first phase-locked loop includes a phase divider, the phase divider producing a plurality of signals, each of the plurality of signals having a non-zero phase relative to other of the plurality of signals, as well as a multiplexer configured to controllably couple one of the plurality of signals to the first resonating member as the drive signal. The act of changing a phase offset introduced into the drive signal includes operating the multiplexer to couple a different one of the plurality of signals to the first resonating member.

Another embodiment provides a system for detecting a physical quantity (for example, an acceleration). The system includes a first oscillation member suspended from a substrate. The first oscillation member may be described as having a first resonant frequency.

The system also includes a second oscillation member suspended from the substrate. The second oscillation member may be described as having a second resonant frequency.

The system further includes a first variable-frequency driver configured to drive the first oscillation member with a first member variable frequency drive signal, and to controllably toggle the first variable frequency drive signal between a first frequency and a second frequency. Indeed, in some embodiments, the first variable-frequency driver is configured to cycle among the first frequency and the second frequency. In some embodiments, the first variable-frequency driver includes a first phase-locked loop. Indeed, in some embodiments, the first phase-locked loop further includes a phase divider configured to produce a plurality of phase-shifted signals, and a multiplexor configured to controllably couple one of the plurality of signals to the first oscillation member as the first drive signal. In some embodiments, the first phase-locked loop is configured to controllably couple one, and then a different one, of the plurality of phase-shifted signals to the first resonating member as the first member variable frequency drive signal to toggle the first member variable frequency drive signal between a first frequency and a second frequency.

The system also includes a second driver configured to drive the second oscillation member at a second member drive frequency. In some embodiments, the second driver includes a second variable-frequency driver configured to drive the second oscillation member with a second variable frequency drive signal, and to controllably toggle the second variable frequency drive signal between a third frequency and a fourth frequency.

In addition, the system includes an oscillation analyzer configured to detect changes in oscillations of the first oscillation member and the second oscillation member in response to acceleration of the system. In some embodiments, the oscillation analyzer includes a first counter coupled to the first member variable frequency drive signal to produce a first frequency count; a second counter coupled to the second member variable frequency drive signal to produce a second frequency count; and a first subtractor configured to offset the first frequency count with the second frequency count to produce a frequency difference count.

In some embodiments, the system also includes an adder circuit configured to offset the frequency difference count with an offset value, the offset value equal to the frequency difference between the first member variable frequency drive signal and the second member variable frequency drive signal.

Further, in some embodiments, at least one control signal controls the first variable-frequency driver to controllably toggle the first variable frequency drive signal between a first frequency and a second frequency, and controls the second variable-frequency driver to controllably toggle the second variable frequency drive signal between a third frequency and a fourth frequency, and controls the oscillation analyzer. For example, in some embodiments, the at least one control signal includes a first control signal coupled to the first variable-frequency driver to controllably toggle the first variable frequency drive signal between a first frequency and a second frequency, and a second control signal coupled to the second variable-frequency driver to controllably toggle the second variable frequency drive signal between a third frequency and a fourth frequency.

In embodiments, the first variable-frequency driver includes a first phase-locked loop having a first phase divider configured to produce a first plurality of phase-shifted signals, and a first multiplexor controlled by the first control signal to controllably couple one of the first plurality of signals to the first oscillation member as the first drive signal, the first control signal coupled to the first multiplexor; and the second driver includes a second phase divider configured to produce a second plurality of phase-shifted signals, and a second multiplexor controlled by the second control signal to controllably couple one of the second plurality of signals to the second oscillation member as the second drive signal, the second control signal coupled to the second multiplexor.

Some embodiments include self-test capacity. To that end, a method of testing a system having a plurality of movable members includes driving a first member with a first member drive signal, and toggling the first member drive signal between a first frequency and a second frequency; driving a second member with a second member drive signal, and toggling the second member drive signal between a third frequency and a fourth frequency; and assessing the operation of the system by comparing oscillations of the first member and the second member to determine whether the members are oscillating at expected frequencies.

In some embodiments, assessing the operation of the system by comparing the first member and the second member oscillations includes determining a first member resonating frequency delta, the first member resonating frequency delta being the difference between frequencies of oscillation of the first member driven at the first frequency and the second frequency, and determining a second member resonating frequency delta, the second member resonating frequency delta being the difference between frequencies of oscillation of the second member driven at the third frequency and the fourth frequency. The method then includes comparing the first member resonating frequency delta and the second member resonating frequency delta.

In some embodiments, the act of determining a first member resonating frequency delta includes filtering a signal representing a difference in oscillation frequency between the first member and the second member to produce first member self-test data and second member self-test data; comparing the first member self-test data and second member self-test data to an expected value; and indicating a malfunction in the system if comparison is not equal to the expected value. For example, in some embodiments, the act of filtering a signal representing a difference in oscillation frequency between the first member and the second member to produce first member self-test data includes filtering the signal with a first bandpass filter and by a low pass filter. Some embodiments include calibrating the first member self-test data.

Some embodiments also include terminating operation of the system if a malfunction is indicated.

Another embodiment of testing a system having a plurality of movable members includes inducing a known displacement of at least one of the plurality of movable members, and then assessing whether the system produces an output accurately reporting such a displacement (e.g., in an accelerometer, an acceleration equal to an acceleration that would cause the known displacement of the at least one of the plurality of movable members). For example, in some embodiments, the at least one of the plurality of movable members is an oscillator, while in some embodiments, the at least one of the plurality of movable members is a frame.

BRIEF DESCRIPTION OF THE DRAWINGS

The foregoing features of embodiments will be more readily understood by reference to the following detailed description, taken with reference to the accompanying drawings, in which:

FIG. 1D schematically illustrates the amplitude and Q-factor of an oscillating beam;

FIG. 1E schematically illustrates the phase shift of an oscillating beam;

FIG. 1G schematically illustrates an alternate embodiment of circuitry for implementing self-test;

DETAILED DESCRIPTION OF SPECIFIC EMBODIMENTS

Various embodiments mitigate the risk of frequency-lock in systems having multiple oscillators, by controllably changing the frequency at which at least one of the resonators oscillates. More particularly, the drive frequency of at least one of the resonators is changed often enough that the multiple resonators do not have time to achieve frequency lock.

For example, frequency lock-in is sometimes a concern for resonant accelerometers. The differential frequencies (due to change in acceleration) can lock to the natural frequency of the structure under acceleration giving false measure of acceleration (or dead zone in more technical terms). Changing the drive frequency of one or more resonators in a resonant accelerometer forces the resonators into a bistable frequency state to mitigate the risk of frequency lock. This approach can also act as a self-test stimulus.

Generally, the principles described herein may be applied to systems having multiple oscillators, and are not limited to accelerometers. Other applications include gyroscopes, and sensors that sense other quantities or measureands, such as mass sensors, in which accretion of a substance on a resonator changes the resonator's oscillation properties.

Figure 1A:
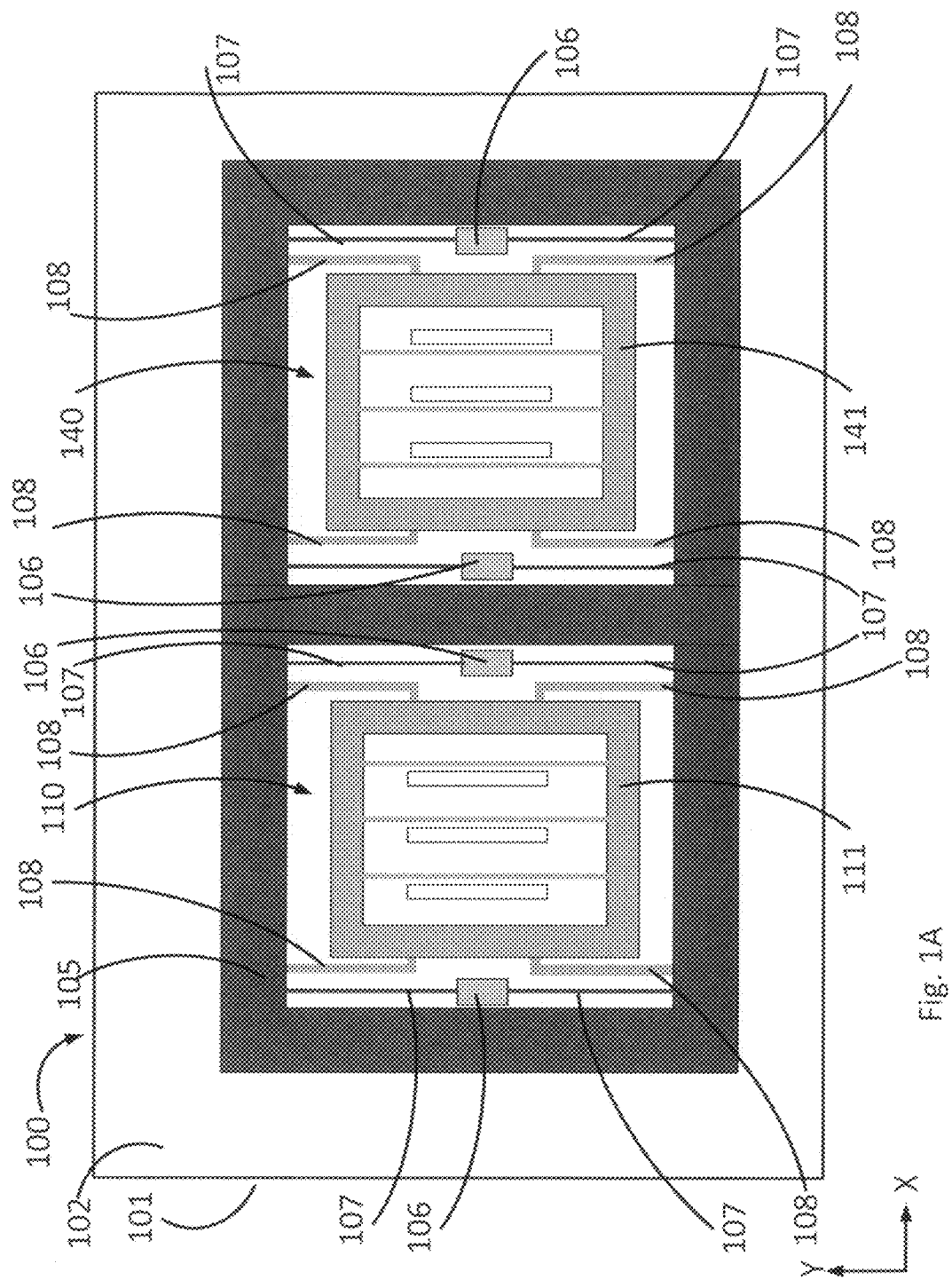
FIGS. 1A-1C schematically illustrate an embodiment of a dual-oscillator system according to a first embodiment.

An embodiment of a multi-oscillator system 100 having a movable frame 105 suspended from a substrate 101 is schematically illustrated in FIG. 1A. The frame 105 is movably suspended adjacent to the surface 102 of substrate 101 by anchors 106 and frame springs 107.

Figure 1B:
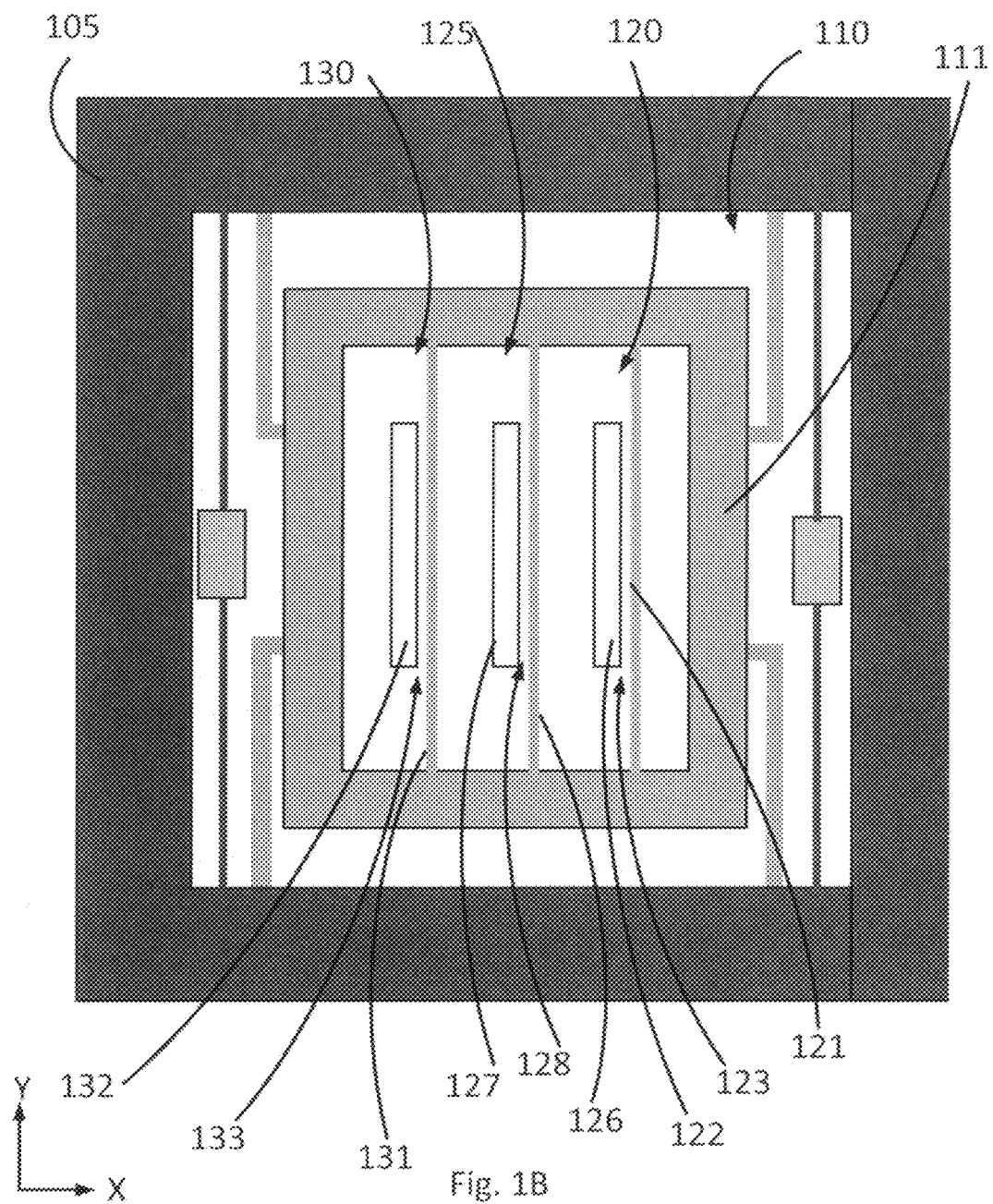
Figure 1C:
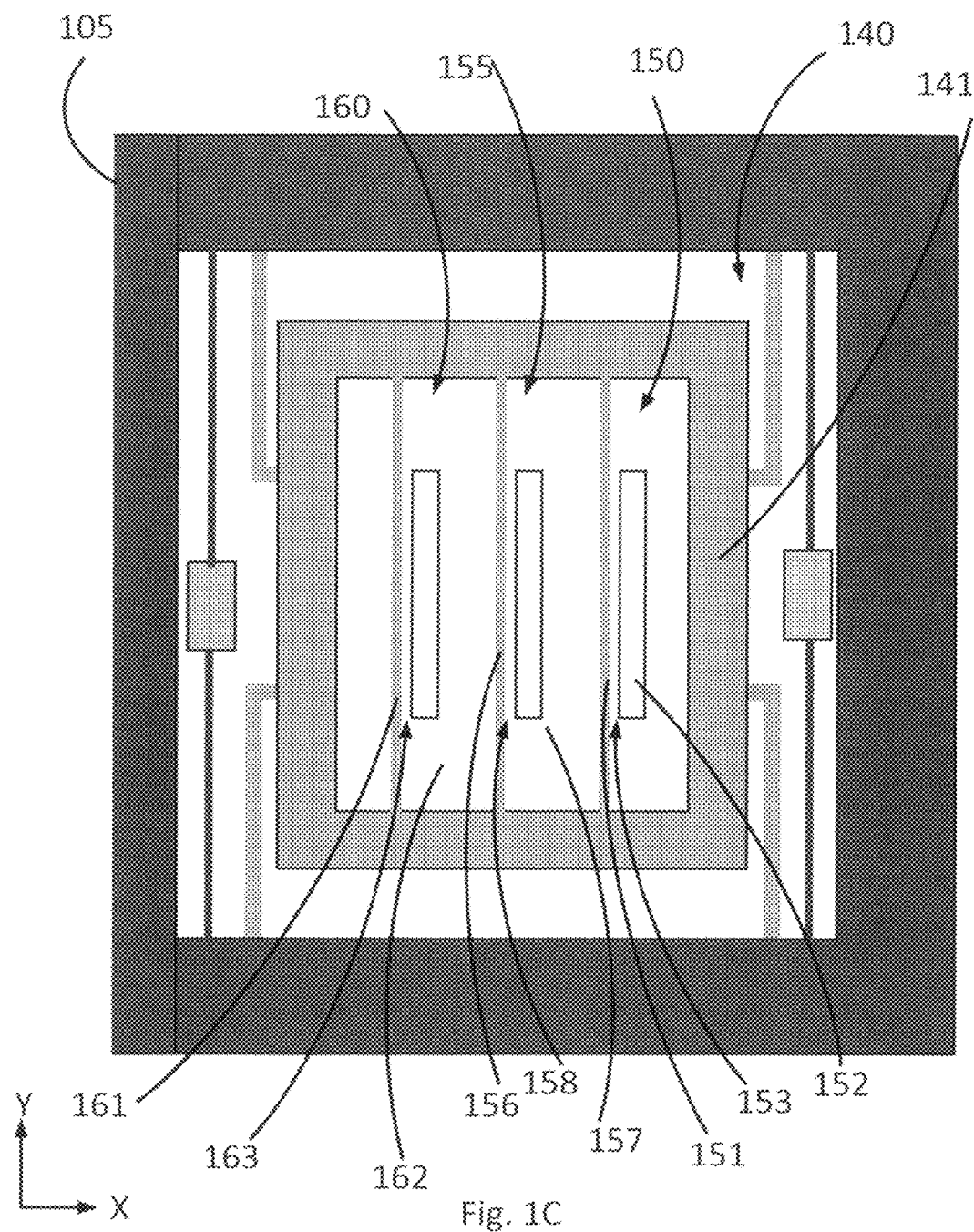

The system 100 includes two resonators 110 and 140 suspended from frame 105 by oscillator springs 108, as schematically illustrated in FIG. 1A, FIG. 1B and FIG. 1C.

Oscillator 110 includes a beam 111 movably suspended from the frame 105 by oscillator springs 108. The oscillator springs 108 are flexible so as to allow the beam 111 to move in the X-axis as indicated in FIG. 1A, but relatively stiff in the Y-axis and Z-axis. In this arrangement, the beam 111 may be said to have an axis of sensitivity parallel to the X-axis.

The beam 111 has a resonant frequency at which the motion of the beam 111 has a phase of 90 degrees relative to the signal driving the beam, in the absence of acceleration applied to the system 100. For example, a graph 170 of the magnitude (or amplitude) of oscillation of a beam such as beam 111 is schematically illustrated in FIG. 1D, where "Wn" (171) indicates the resonant frequency of the beam 111. FIG. 1E schematically illustrates the phase of the beam 111. As shown in FIGS. 1D and 1E, the magnitude of oscillation is at a maximum (176) at its resonant frequency 171, and the phase (186) is at 90 degrees.

At any frequency other than the resonant frequency 171, the amplitude of the beam's oscillation will be less than at its resonant frequency, and the phase will be other than 90 degrees. For example, at a frequency 172 below the resonant frequency 171, the amplitude 177 of the beam's oscillating may be lower than the amplitude 176 of oscillation at resonant frequency 171, and its phase 187 will be less than 90 degrees. Similarly, at a frequency 173 above the resonant frequency 171, the amplitude 178 of the beam's oscillating may be lower than the amplitude 176 of oscillation at resonant frequency 171, and its phase 188 will be greater than 90 degrees.

The oscillator 110 also has a tuning capacitor 130 with stationary electrode 132 coupled to the substrate 101 and a movable electrode 131 coupled to the beam 111. The stationary electrode 132 is separated from movable electrode 131 by tuning gap 133. Electrostatic forces between stationary electrode 132 and movable electrode 131 acts as an electrostatic negative spring force, as known in the art. The change in static gap 133 or change static bias between the two electrodes of this capacitor 130 will change the natural frequency of oscillator 110, accordingly, as known in the art.

The beam 111 may be moved into oscillation parallel to the X-axis by drive 120. Specifically, application of an alternating voltage to the fixed finger 122 produces an alternating electrostatic force on movable drive finger 121 and therefore on the beam 111, in the direction of the fixed finger 122. The alternating voltage may be periodic, for example.

The motion of the beam 111 may be detected by the sense capacitor 125, as known in the art.

The system 100 of FIG. 1A has a second oscillator 140 with similar construction, including anchors 106, frame springs 107, beam 141, and oscillator springs 108. The second oscillator is schematically illustrated in FIG. 1C, and includes a second driver 150 having a second movable drive finger 151, and a second fixed drive finger 152 defining a second drive gap 153; a second sensing capacitor 155 having a second movable sense finger 156 defining a second sense gap 158 with second fixed sense finger 157, and a second tuning capacitor 160 having a second movable tuning finger 161 defining a second tuning gap 163 with second fixed tuning finger 162.

Generally, the operation of the second oscillator 140 is similar to the operation of the first oscillator 110 as described above.

In this embodiment, the fixed fingers (152, 157 and 162) of the second oscillator 140 are disposed on the opposite sides of their respective movable fingers (151, 156 and 161) compared to the positions of the fixed drive fingers (122, 127 and 132) and their respective movable fingers (121, 126 and 131). As schematically illustrated in FIG. 1A, for example, fixed drive finger 122 is in the negative X direction relative to the movable drive finger 121 (FIG. 1B), whereas fixed drive finger 152 is in the positive X direction relative to movable drive finger 151 (FIG. 1C).

When the system 100 is subject to acceleration in the positive X direction, and in accordance to newton's law, the movable frame 105 moves in the negative X direction, the gaps 123, 128 and 133 of the first oscillator 110 narrow as the movable fingers 121, 126 and 131 move closer to the fixed fingers 122, 127 and 132, and the gaps 153, 158 and 163 of the second oscillator 140 widen as the movable fingers 151, 156 and 161 move further from the fixed fingers 152, 157 and 162. As a consequence, the electrostatic negative spring forces within the system 100 change (increase or decrease) accordingly, since electrostatic force is, in part, a function of the magnitude of the gap between electrodes. Therefore, natural frequency of the oscillator 110 decreases and natural frequency of the oscillator 140 increases. Conversely, when the system 100 is subject to acceleration in the negative X direction, the movable frame moves in positive X direction, the gaps 123, 128 and 133 of the first oscillator 110 widen and the gaps 153, 158 and 163 of the second oscillator 140 narrow. Therefore, natural frequency of the oscillator 110 increases and natural frequency of the oscillator 140 decreases.

System Block Diagram

Figure 2:
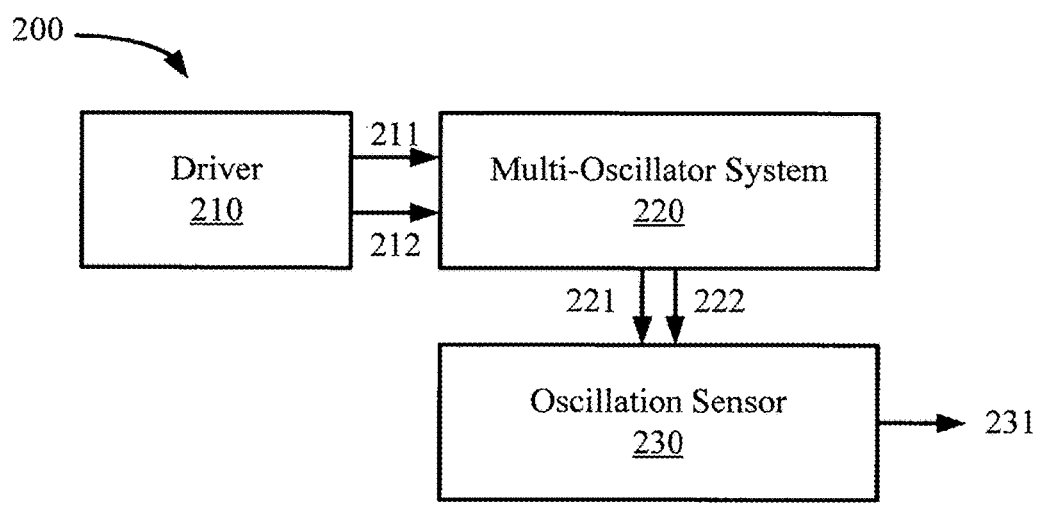
FIG. 2 schematically illustrates a system for detecting a change of oscillation properties in a multi-oscillator system.

FIG. 2 schematically illustrates an embodiment of a system 200 for detecting a change of oscillation properties in a multi-oscillator system 220. The system 200 includes a driver 210 (which may also be considered to be two or more drivers) that produces drive signals to each of the resonators in the multi-oscillator system 220. The multi-oscillator system 220 may have two oscillators, or more than two oscillators, but a two-oscillator system is described herein for illustrative purposes. In some embodiments, the multi-oscillator system may 220 be a device such as MEMS device 100 for example, although the utility of the principles described herein is not limited to two-oscillator systems and is not limited to MEMS devices.

Each oscillator in the multi-oscillator system 220 has a natural resonant frequency (fo) when the system 220 is not under acceleration. The natural resonant frequencies of the resonators in the multi-oscillator system are not necessarily identical.

In operation, the driver 210 supplies unique drive signals (211, 212) to each oscillator in the multi-oscillator system 220. In illustrative embodiments, each oscillator in the multi-oscillator system 220 is driven at a drive frequency that is not equal to its natural resonant frequency. In this way, the risk of frequency lock among the resonators in the multi-oscillator system 220 may be reduced.

In some embodiments, the drive frequency of at least one of the resonators in the multi-oscillator system 220 is changed from time to time, to further reduce the risk of frequency lock among the resonators in the multi-oscillator system 220. In other embodiments, the drive frequency of more than one oscillator, and/or the drive frequency of each of the resonators in the multi-oscillator system 220, are changed from time to time for the same reason.

When the multi-oscillator system 220 is subject to a physical quantity (such as an acceleration of the system, or accretion of mass on an oscillator, to name but a few examples), a resonant property (such as the resonant frequencies, respectively, for example) of the resonators in the multi-oscillator system 220 change. The resonators in the multi-oscillator system 220 are configured such that their resonant frequencies change differently. For example, in a two-resonator system under acceleration, the resonant frequency (fo1) of a first resonator increases (to fo1') and the resonant frequency (fo2) of the second resonator decreases (to fo2').

Those changes are indicative of the magnitude and direction of the acceleration, and may be detected by the oscillation analyzer 230 by a signal or signals (221, 222) from the multi-oscillator system 220 to produce an output signal 231 indicative of the acceleration.

In some embodiments, a multi-oscillator system (such as system 220, for example) may be configured as a sensor for detecting a physical quantity (which may be referred-to as a "measurand"). Such as sensor has more than one resonating member, and at least one of the resonating members has a resonant property (e.g., a resonant frequency) that is affected by (or affectable by) the physical quantity to be detected. For example, a resonating member having a resonant property may be affected by (changed by) the presence of, or change of, the physical quantity to be detected. As described in examples below, such a system may be operated by oscillating a first resonating member at a frequency determined at least in part by the resonant property of the first resonating member, and modulating the frequency of oscillation of the first oscillator. For example, some embodiments described below controllably toggle a drive frequency of a signal produced by a drive circuit and used to drive a resonating member. Thus, the oscillation frequency is modulated by changing (toggling) the frequency of the drive signal (e.g., by the operation of the drive circuit, which change is in addition to a change of oscillating properties or oscillation frequency induced by the physical quantity to be detected). Consequently, such modulation of oscillation frequency occurs even in the absence of a physical quantity to be detected, for example, when a drive frequency is toggled in an accelerometer that is not accelerating. The operation of the system also includes oscillating a second resonating member at a frequency determined at least in part by the resonant property of the second resonating member. The system may then detect, and/or measure, the physical quantity by assessing changes in the oscillation frequencies among the first and second resonating members.

Accelerometer Embodiment

One application for a multi-oscillator system is an accelerometer. Although the utility of the technology disclosed herein may be useful in other applications, a discussion of an accelerometer embodiment is useful in disclosing aspects of the technology.

Figure 3A:
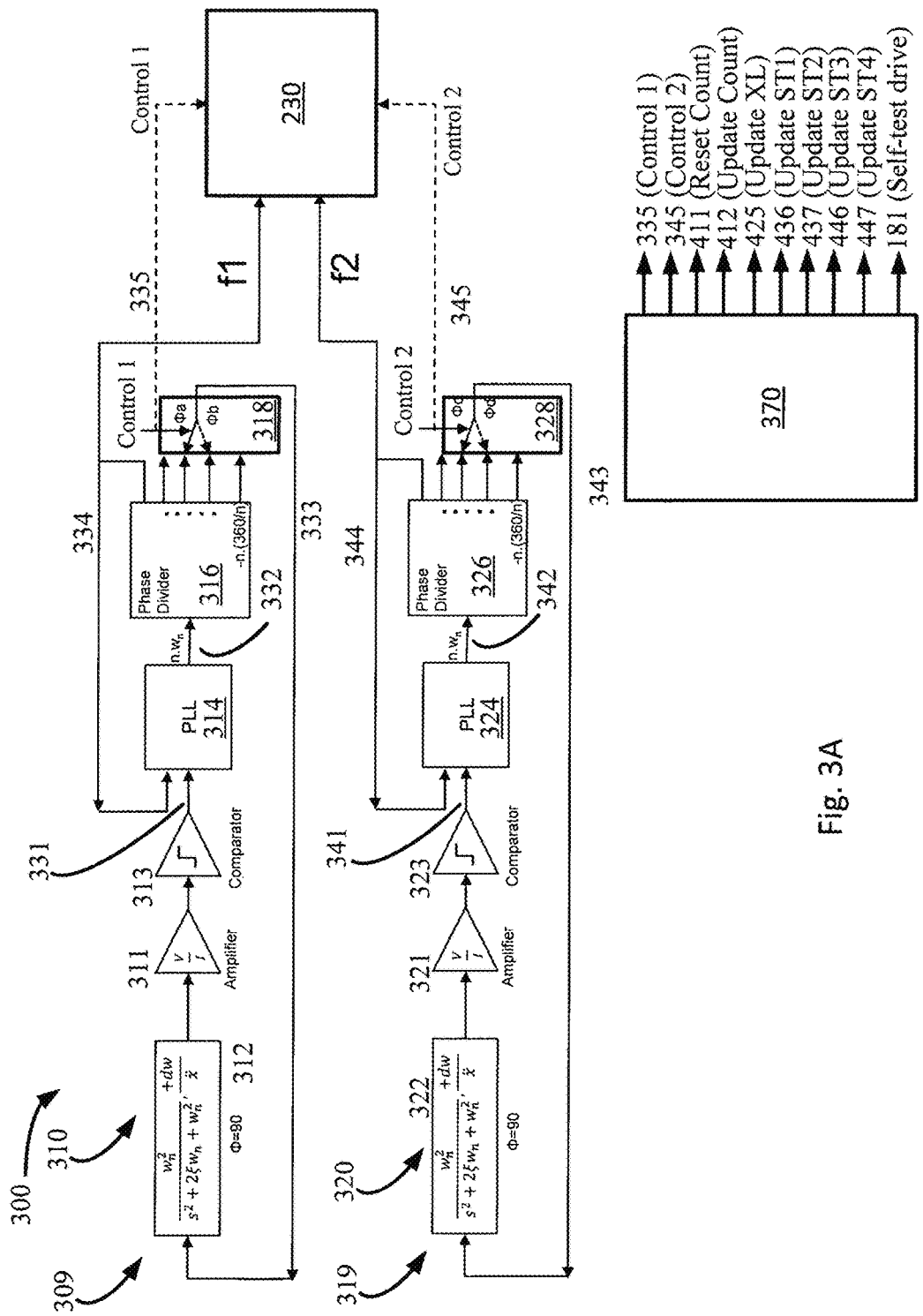
FIG. 3A and FIG. 3B schematically illustrates an embodiment of a multi-oscillator system.

To that end, an embodiment of multi-oscillator system as an accelerometer is schematically illustrated in FIG. 3A, in which two resonators 312, 322 are driven by drive circuits 310 and 320 respectively, and acceleration is determined by oscillation analysis circuit 230. Collectively, the drive circuits 310 and 322, along with the resonators 312 and 322 respectively, may be referred to as "oscillators" 309 and 319, respectively.

The resonators 312, 322 may be resonators 110 and 140 in a multi-oscillator system as schematically illustrated in FIG. 1A for example, although other resonators are known in the art and may be used. Each resonator is suspended and driven along an axis of sensitivity, such as the X-axis in FIG. 1A for example.

The first resonator 312 is driven by a drive signal 333 produced by first PLL driver 314 and first phase divider 316. The first resonator 312 oscillates at a phase relative to the drive signal 333, which phase depends on the proximity of the frequency of the drive signal 333 to the resonant frequency of the resonator 312.

System 300 includes a transimpedance amplifier 311 and a comparator 313 between the resonator 312 and the PLL 314. The transimpedance amplifier 311 is electrically connected to one of the electrodes of the sense capacitor 125 in FIG. 1A and FIG. 1B to transduce the charge per unit time (or a current) signal to a voltage signal. The voltage output of the transimpedance amplifier 311, in turn, is input to comparator 313, which compares the voltages signal to a reference voltage to produce a binary output signal 331. The binary output signal 331 is input to the PLL 314.

In this embodiment, the PLL 314 produces a base drive signal 332 that is an integer multiple of the resonant frequency of the resonator 312, and the phase divider 316 includes one or more digital divider circuits, as known in the art, to reduce the frequency of the base drive signal 332.

Figure 3B:
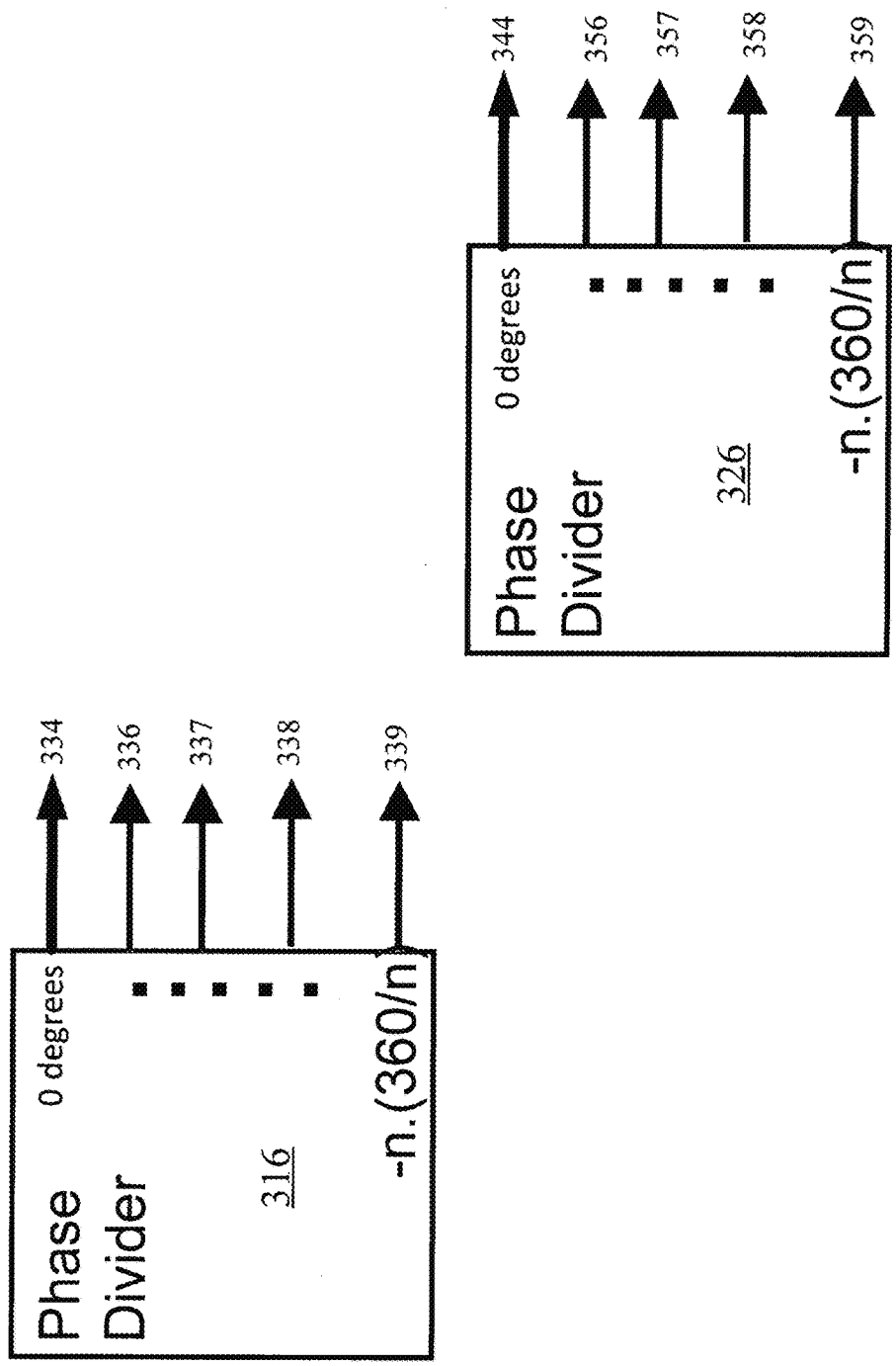

The phase divider 316, as shown in FIG. 3B includes phase delay circuitry, as known in the art, to produce two or more drive signals (e.g., 336, 337, 338, 339) each of which is a phase-shifted version of the frequency-reduced base drive signal 332. In this embodiment, signal 334 is the frequency-reduced base drive signal 332 with a zero-degree phase shift.

Each of the phase-shifted drive signals (e.g., 336, 337, 338, 339) may be used as the signal 333 that drives the resonator 312. For example, a multiplexer 318 (which may be a two-input, single-output switch, in some embodiments) receives the phase-shifted drive signals (e.g., 336, 337, 338, 339) and couples one of them to the resonator 312 as drive signal 333, under control of a signal 335 (e.g., which may be a periodic signal e.g., a clock, or an aperiodic signal). For example, if the control signal 335 is a clock signal (e.g., a square wave) the multiplexer 318 alternately and periodically forwards phased-clock signals 337 and 338 to the resonator 312 as drive signal 333.

In some embodiments, the control signals 335, 345 may be provided by a system clock. In other embodiments, the control signals 335, 345 may be provided by a system controller 370, which may be an integrated circuit such as a controller, a microprocessor, a combination of analog switch, or even a digital signal processor. System controller 370 also provides signals for oscillation analyzer 230. In some embodiments, the system controller 370 may be a state machine, configured to cycle among different output states, for example in response to a system clock. For a simple example, such a state machine may cycle the control signals 335 and 345 among the following states of digital output: 00-01-10-11.

The resonators (e.g., 312, 322) may be driven in a variety of ways, some of which are described below.

A. Oscillating at Natural Resonant Frequency

For example, to drive the resonator 312 at its natural resonant frequency, the drive signal 333 has a frequency equal to that natural resonant frequency. The phase divider 316 produces a feedback signal (or reference signal) 334 having the same frequency, but a phase of 0 degrees (zero degrees) relative to the base drive signal 332, and supplies that feedback signal 334 to the PLL driver 314. The phase divider 316 also produces oscillator drive signal 333 having a phase of −90 degrees (negative ninety degrees) relative to the base drive signal 332, and supplies that drive signal 333 to the resonator 312.

At its natural resonant frequency, the resonator 312 oscillates at a phase of 90 degrees (ninety degrees) relative to the drive signal 333, and so a phase detector in the PLL driver 314 detects that the phase of the first resonator (represented by signal 331) is equal to the phase of the feedback signal 334. The PLL driver 314 then continues to provide a first base drive signal 332 to phase divider 316, and the phase divider 316 produces the drive signal 333 and the feedback signal 334 from signal 332.

The system 300 drives the second resonator 322 in a similar fashion, via circuit 320, which includes amplifier 321, comparator 323 producing second oscillator signal 341, PLL driver 324, producing second base drive signal 342 to phase divider 326, and multiplexor 328 controlled by second control signal 345 to produce second oscillator drive signal 343 and second feedback signal 344.

B. Oscillating at Non-Identical Frequencies

In some embodiments, multiple resonators are driven at different (not identical) frequencies. In some embodiments, at least one of those drive frequencies is not equal to the resonators' respective natural resonant frequencies. For example, in the embodiment 300 of FIG. 3A, such operation may be implemented by introducing phase shifts into the drive signals 333 and/or 343.

Taking circuit 310 and drive signal 333 as an example, in one embodiment the phase divider 316 may introduce an additional phase shift of 10 degrees (which is also −350 degrees) onto the oscillator signal 331 to produce drive signal 333, while still keeping a phase difference of zero degrees between feedback signal 334 and the oscillator signal 331. More specifically, in the embodiment of FIG. 3A, the multiplexer 318 couples a signal (e.g., one of signals 337 or 338, for example) having a −80 degree phase shift from the phase divider (316) (instead of the −90 degree phase shift described above, which causes the resonator to oscillate at its resonant frequency) to the resonator 312 as the drive signal 333.

The circuit 310 (including PLL 314) reacts to eliminate the phase difference between oscillator signal 331 and feedback signal 334. As a practical matter, this means that the drive circuit 310 will adjust the frequency of drive signal 333 to a frequency below the natural resonant frequency of resonator 312, to a point where the resonator 312 oscillates at a phase of 80 degrees relative to drive signal 333. Consequently, the resonator 312 is driven to oscillate at that frequency, which is below its natural resonant frequency.

In some embodiments, the resonator 312 is driven to oscillate at a frequency, above its natural resonant frequency by introducing a negative phase difference into to the drive signal 333. For example, phase divider 316 may produce a drive signal 333 having a phase shift of −20 degrees relative to the feedback signal 334. The PLL 314 reacts to eliminate the phase difference between oscillator signal 331 and feedback signal 334. As a practical matter, this means that the drive circuit 310 will adjust the frequency of drive signal 333 to a frequency above the natural resonant frequency of resonator 312, to a point where the resonator 312 oscillates at a phase of −110 degrees relative to drive signal 333. Consequently, the resonator 312 is driven to oscillate at that frequency, which is above its natural resonant frequency.

The foregoing examples are merely illustrative, and do not limit the utility of the concepts described. For example, the resonator 312 can be made to oscillate at any of a wide range of frequencies above or below its natural resonant frequency by selection of the phase the drive signal 333. Resonator 322 may be made to oscillate similarly via circuit 320.

C. Changing Oscillation Frequencies

In some embodiments, the frequency of the drive signal 333 may be changed (or "toggled") from time to time, and even periodically, for example in response to a control signal 335 and/or 345. For example, the phase of the drive signal 333 may be changed, and therefore the oscillation frequency of resonator 312 changed accordingly, at intervals of time that are too short to allow the resonator 312 to frequency lock to another resonator in a multi-oscillator system (e.g., resonator 322, for example). The interval between such changes may be determined by a system designer based on factors unique to each system.

In some embodiments, the drive frequencies of one or more of the resonators 312 and 322 are changed at regular intervals (e.g., periodically), while in some embodiments, those drive frequencies are changed at irregular intervals. In some embodiments, the drive frequencies of the resonators 312 and 322 are changed synchronously. For example, in some embodiments, the drive frequencies of resonators 312 and 322 are changed simultaneously, while in some embodiments, the drive frequencies of the resonators 312 and 322 are changed non-simultaneously.

In some embodiments, the drive frequency of the resonator 312 is set to a frequency below its natural resonant frequency, and the drive frequency of the resonator 322 is set to a frequency above its natural resonant frequency. In some embodiments, the respective drive frequencies of resonators 312 and 322 are both set below their respective natural resonant frequencies, and in other embodiments, the respective drive frequencies of resonators 312 and 322 are both set above their respective natural resonant frequencies. In some embodiments, at least one frequency at which a resonator is driven if offset from the resonator's resonant frequency.

In some embodiments, the drive frequency of the resonator 312 and/or resonator 322 may be changed from a frequency that is below their respective natural resonant frequencies to a frequency that is above their respective natural resonant frequencies; and vice versa.

As described above, the drive frequencies change in response to control signals 335 and 345. Consequently, the drive frequencies may be described as being frequency modulated by control signals 335 and 345. As described below, the drive frequencies are further modulated by circuit 310 and 320 in response to acceleration. Consequently, the signals may therefore be described as double-frequency modulated (or twice-frequency modulated).

D. Reaction of System to Changes in Resonant Frequency

If the resonant frequency of the resonator 312 changes to a new resonant frequency, for example due to an acceleration applied to the system 300, the PLL reacts by adjusting the frequency of the drive signal 333 (and also of the feedback signal 334), so as to reduce the difference in phase between the feedback signal 334 and the oscillator signal 331 from the resonator 312 to be as close to zero degrees as possible. In practical effect, this adjusts the frequency of the drive signal 333 to the new resonant frequency of the resonator 312.

A second drive circuit 320 drives the second resonator 322 with output 323, in similar fashion, by producing drive signal 343 and feedback signal (or reference signal) 344 via PLL driver 324 and via a second phase shifter 326.

Each oscillator circuit 310 and 320 produces a signal which is then used by an oscillation analyzer (e.g., 230) to do the analysis to properly determine and represent magnitude and sign of acceleration data and continuous self-test data, as described further below.

Oscillation Analysis

Changes in the oscillation of the resonators 312 and 322 may be used by an oscillation sensor circuit to determine and quantify the cause of the changes, such as acceleration for example.

Figure 4A:
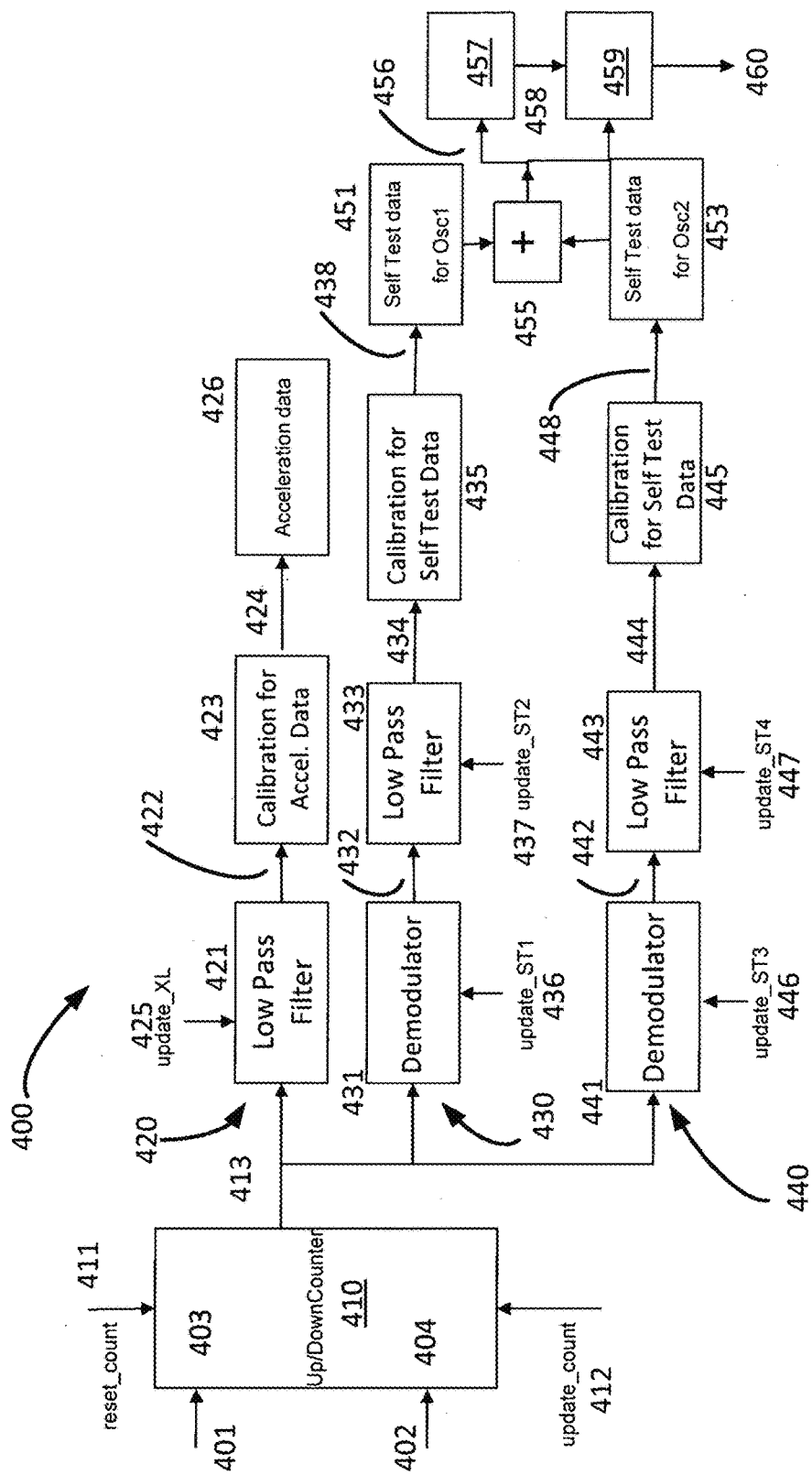
FIG. 4A schematically illustrates an embodiment of an oscillation analyzer.
Figure 4B:
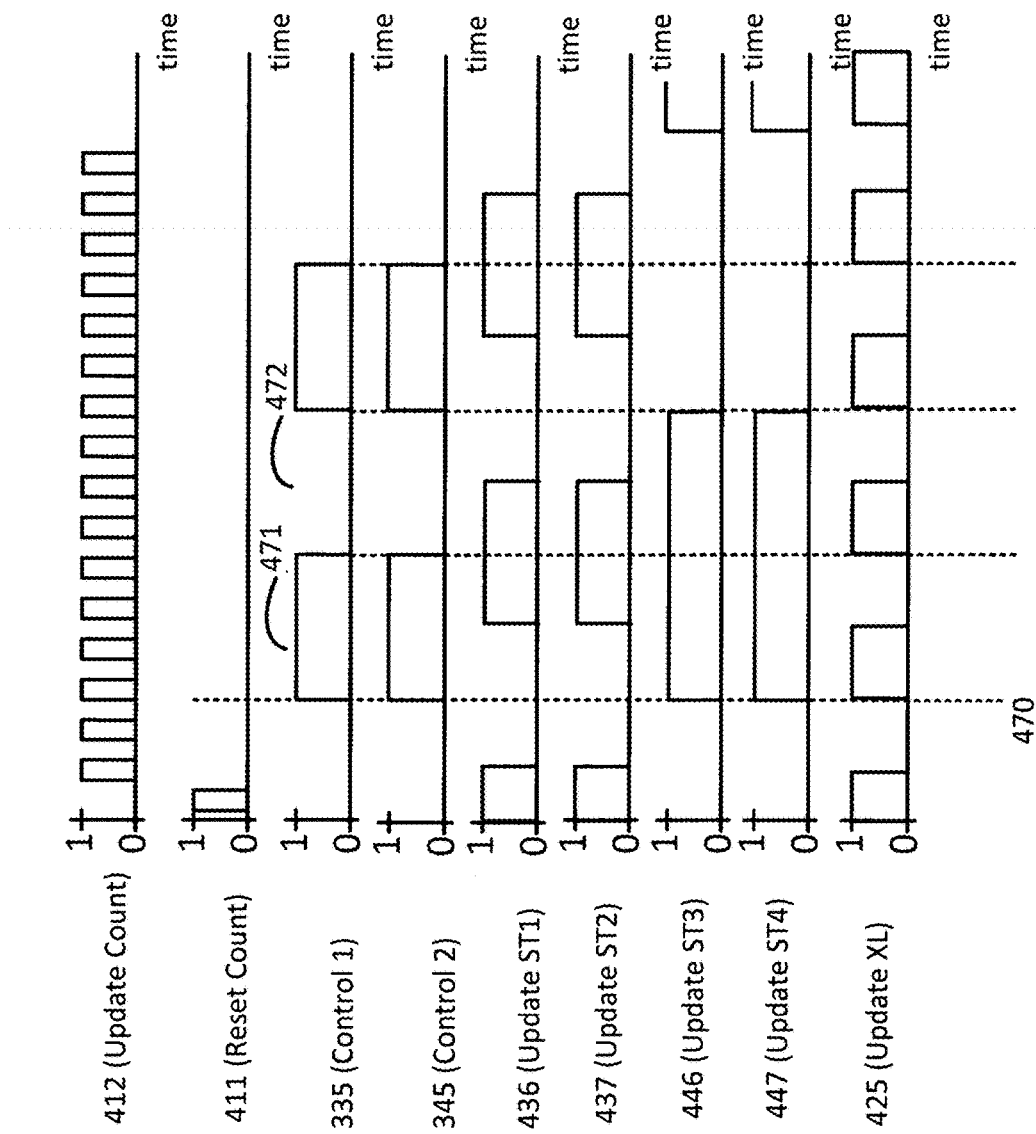
FIG. 4B schematically illustrates examples of signals in the oscillation analyzer of FIG. 4A.
Figure 4C:
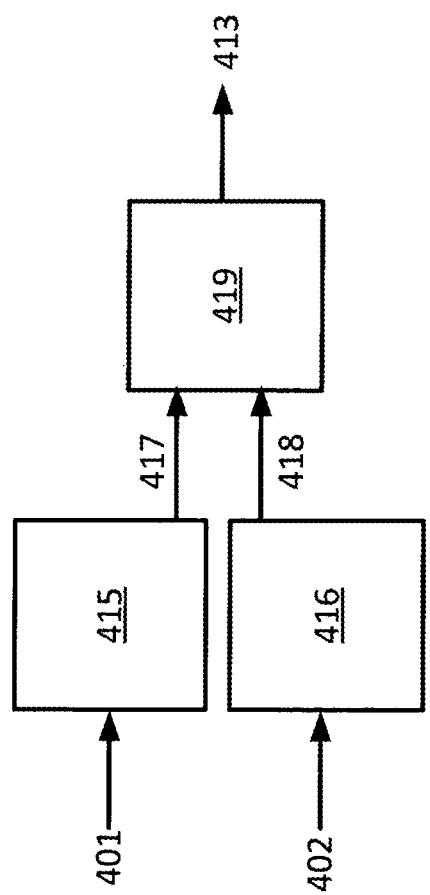
FIG. 4C schematically illustrates an embodiment of and up-down counter.

When the resonators of a multi-oscillator system are simultaneously driven at different frequencies, the frequencies of the feedback signals (334; 344) of the PLLs (314; 324) are also different. One embodiment 400 of a digital oscillation analyzer is schematically illustrated in FIG. 4A and includes an up-down counter 410 which receives signal 401 (which may be, for example, drive signal 333 or feedback signal 334) from oscillator circuit 310 and signal 402 (which may be, for example, drive signal 343 or feedback signal 344) from oscillator circuit 320 to produce difference of count between two inputs. The count is incremented with rising edge of first signal 401 and decremented with rising edge of second signal 402. Some signals within the system 400 are schematically illustrated in FIG. 4B. Consequently, the operation of up-down counter 410 may be described as assessing changes in an oscillation frequency of the first oscillating member relative to an oscillation frequency of the second oscillating member. In some embodiments, such as the circuit schematically illustrated in FIG. 4C, the up-down counter 410 includes a first counter 415 that counts incoming signal 401 (i.e., the drive signal of the first oscillator) to produce a first frequency count 417, and a second counter 416 that counts incoming signal 402 (i.e., the drive signal of the second oscillator) to produce a second frequency count 418. The first frequency count 417 and second frequency count 418 are coupled to a subtractor 419, which may be a combinatorial logic subtraction circuit for example, which produces frequency difference count (413).

For purposes of illustration, if the system 300 is not under acceleration, and if the first resonator 312 is driven at 70,000 Hz (i.e., 70 kHz), and the second resonator 322 is driven at 71,000 Hz (i.e., 71 kHz), then up-down counter 410 increments the count 403 at the rate of 70,000 edges/second and decrements the count 404 at the rate of 71,000/second.

Examples described herein may refer to frequencies and counting for sample periods of one second, but it is not necessary that the up-down counter 410 count all edges for a full second, since the frequencies of the signals 401 and 402 can be determined with shorter (or longer) sampling times. For example, the oscillation analyzer 400, described below, may sample signals during sample periods much shorter than one second. In some embodiments, the sample period (i.e., the time during which the oscillation analyzer 400 samples signals from a system, such as in system 300, for example) may be 10 microseconds, while in other embodiments the sample period may be 100 microseconds, to name but a few examples. Further, in some embodiments, one, or more oscillator drive frequencies may be toggle during a sample period. For example, some embodiments toggle one or more oscillator drive frequencies at the midpoint of a sample period (see, for example, control signals 335 and 345 toggling at point 470 in FIG. 4B), although other embodiments may toggle one or more oscillator drive frequencies at other points within a sample period.

The refresh rate of the digital information at the output of up-down counter 410 is determined by counter update signal 412 provided by system controller 370 which enables the counter 410 to count the incoming signals 401 and 402, and can be reset (e.g., to all zeros) by counter reset signal 411. Some or all of the circuits schematically illustrated in FIG. 4 may be implemented in circuitry (e.g., digital counters, adders, memory, registers, application specific integrated circuit, etc.), or on a programmed processor such as a controller, microprocessor or digital signal processor (e.g., 370) for example.

The output count 413 is the difference between two counts 403 and 404, and has the information of both acceleration and self-test data. The analyzer function is to produce each of the acceleration and self-test signal. The method mentioned below is just one way of achieving to the desired information but it can be done in many different ways, as known in the art. In the present example, a count output 413 is a measure of difference of (negative) 1,000 [i.e., 70,000−71,000=−1,000]. The count 413 of −1000 then goes through a low pass digital filter 421 driven by signal update_XL 425 to produce base-band information 422. Thus, when the system 300 is not accelerating, the frequency difference (or offset) between the channels is −1,000 Hz, and if the system detects that difference, the system can conclude that the system is not accelerating. This offset of 1000 can be stored as part of the calibration or offset adjuster 423 (which may be implemented as a digital circuit, such as an adder, or an algorithm running on a processor such as controller 370, in various embodiments), and used to adjust the (filtered) output data 413 from counter 410 to produce an acceleration data output 424 of 0 (zero) [i.e., −1000 from counter 410+1,000 from offset adjuster 423=0]. This result may be stored in register 426, where the result 0 (zero) indicates no acceleration. In some embodiments, the offset adjuster 423 may be an adder configured to offset the frequency difference count with the offset value, and/or a routine that calibrates acceleration data over change in external environmental changes like temperature.

On the other hand, if the system is under one gee of acceleration (i.e., equal to one times the acceleration of gravity at the surface of the Earth) in the +X (positive X) direction, the oscillation frequencies of the resonators 312, 322 change in a measurable way. In a simple example, the oscillation frequency of resonator 312 may increase from 70,000 Hz to 70,010 Hz, and the oscillation frequency of resonator 322 may decrease from 71,000 Hz to 70,990 Hz. In the manner described above, the up-down counter 410 produces the count output 413 of −980 [70,010−70,990=−980]. Consequently, the acceleration signal path (or circuit) 420 produces the acceleration data output 424 of 20 [i.e., −980 from up-down counter 410+1000 from calibration routine 423=+20], which is a measure of the physical quantity to be detected (in this example, acceleration). That result may be stored in register 426, where the sign of the result (positive) indicates acceleration in the +X direction, and the size of the result (20) indicates the magnitude of the acceleration—in this case, 1 gee.

In another example, if the system is under one gee of acceleration (i.e., equal to one times the acceleration of gravity at the surface of the Earth) in the −X (negative X) direction, the oscillation frequencies of the resonators 312, 322 change in a measurable way, but different from the case of acceleration in the positive X direction. In a simple example, the oscillation frequency of resonator 312 may decrease from 70,000 Hz to 69,990 Hz, and the oscillation frequency of resonator 322 may increase from 71,000 Hz to 71,010 Hz. In the manner described above, the up-down counter 410 produces an output of −1020 [69,990−71,010=−1020]. Consequently, the acceleration signal path 420 produces the acceleration data output 424 of −20 [i.e., −1020 from up-down counter 410+1000 from calibration routine 423=−20]. That result may be stored in register 426, where the sign of the result (negative) indicates acceleration in the −X direction, and the size of the result (20) indicates the magnitude of the acceleration—in this case, 1 gee.

The oscillation analyzer 400 operates similarly when the drive frequencies of the resonators 312 and 322 are toggled. For example, consider an embodiment in which the drive frequency of resonator 312 is toggled by +/−100 Hz between 69,900 Hz and 70,100 Hz, and at the same time, the drive frequency of resonator 322 is toggled between 70,900 Hz and 71,100 Hz (in each case, by introducing a phase shift into their respective drive signals as described above, for example).

Examples of toggling drive frequencies are presented below. In general, the drive frequency of the first resonator 312 is controlled by signal control 1 (335), which drives at a first frequency when that signal has a value of 0, and a different frequency when that signal has a value of 1. Similarly, the second resonator 322 is controlled by signal control 2 (345), which drives at a first frequency when that signal has a value of 0, and a different frequency when that signal has a value of 1. Toggling drive frequencies may be expressed in terms of the pre-toggle value of drive signals 335 and 345, and the post-toggle values of those signals. For example, if signals 335 and 345 are both zero before toggling, that state may be expressed as: 0:0. If signals 335 and 345 are both one after toggling, that state may be expressed as: 1:1. Thus, the toggle may be expressed as: 0:0 to 1:1 [or 0:0-1:1]. Other permutations include: 0:0-0:1; 0:0-1:0; 1:1-0:0; 1:1-1:0; 1:1-0:1; 1:0-0:0; 1:0-0:1; 1:0-1:1; 0:1-0:0; 0:1-1:0; 0:1-1:1. The examples below are expressed in terms of specific drive frequencies, but those frequencies are merely for illustration, and are not limiting.

Toggle Example 1 [0:0 to 1:1] [69,900 Hz:70,900 Hz to 70,100 Hz:71,100 Hz]

Pre-Toggle (69,900 Hz and 70,900 Hz) [Control Signals: 0:0]: Beginning at a time when resonator 312 is driven at 69,900 Hz, and resonator 322 is driven at 70,900 Hz, and the system is under no acceleration. The up-down counter 410 then produces the count output 413 of −1000 [69,900−70,900=−1000]. In this mode, the filter produces an base-band value of (negative) 1000, so that calibration routine 423 produces a result of zero [i.e., −1000 from up-down counter 410+1000 from calibration routine 423=0] for a case of no acceleration.

Under a 1 gee acceleration in the +X direction when resonator 312 is driven at 69,900 Hz, and resonator 322 is driven at 70,900 Hz, the oscillation frequency of resonator 312 may increase from 69,900 to 69,910 Hz, and the oscillation frequency of resonator 322 may decrease from 70,900 Hz to 70,890 Hz. In the manner described above; the up-down counter 410 produces the count output 413 of −980 [69,910−70,890=−980]. Consequently, the acceleration signal path 420 produces the acceleration data output 424 of +20 [i.e., −980 from up-down counter 410+1000 from calibration routine 423=+20]. That result may be stored in register 426, where the sign of the result (positive) indicates acceleration in the +X direction, and the size of the result (20) indicates the magnitude of the acceleration—in this case, 1 gee.

Under a 1 gee acceleration in the −X with the same driver frequencies, the oscillation frequency of resonator 312 may decrease from 69,900 to 69,890 Hz, and the oscillation frequency of resonator 322 may increase from 70,900 Hz to 70,910 Hz. In the manner described above, the up-down counter 410 produces the count output 413 of −1020 [69,890−70,910=−1020] and the calibration routine 423 produces an output of −20 [i.e., −1020 from up-down counter 410+1000 from calibration routine 423=−20], indicating an acceleration of 1 gee in the −X direction.

Post Toggle (70,100 Hz and 71,100 Hz) [Control Signals: 1:1]: Then, after toggling the drive frequencies, resonator 312 is driven at 70,100 Hz, and resonator 322 is driven at 71,100 Hz. Under no acceleration, the up-down counter 410 produces the count output 413 of −1000 [70,100−71,100=−1000]. Acceleration signal path 420 produces the acceleration data output 424 of zero for no acceleration [i.e., −1000 from up-down counter 410+1000 from calibration routine 423=0].

A 1 gee acceleration in the +X direction causes the oscillation frequency of resonator 312 to increase from 70,100 Hz. to 70,110 Hz, and the oscillation frequency of resonator 322 to decrease from 71,100 Hz to 71,090 Hz. In the manner described above, the up-down counter 410 produces the count output 413 output of −980 [70,110−71, 090=−980]. Consequently, the acceleration signal path 420 produces the acceleration data output 424 of +20 [i.e., −980 from up-down counter 410+1000 from calibration routine 423=+20]. That result may be stored in register 426, where the sign of the result (positive) indicates acceleration in the +X direction, and the size of the result (20) indicates the magnitude of the acceleration—in this case, 1 gee.

Similarly, a 1 gee acceleration in the −X direction causes the acceleration signal path to produce the acceleration data output 424 of −20.

Toggle Example 2 [0:0 to 0:1] [70,000 Hz:71,100 Hz to 70,000 Hz:70,900 Hz]

For another example, consider an embodiment in which the drive frequency of resonator 312 remains at 70,000 Hz while the drive frequency of the second resonator 322 is toggled between 70,900 Hz and 71,100 Hz with control 2 signal 345, the analysis changes again. Some embodiments, such as this one, toggle one or more drive frequencies during a sample period. For example, see FIG. 4B, in which the control signals 335 and/or 345 change, at point 470. In this embodiment, the toggle of a control signal (e.g., 335, 345) defines two half-cycles (first half 471 and second half 472, respectively, of control signal 335). The signals of FIG. 4B are schematic and illustrative, and do not limit the scope of embodiments disclosed herein. A person of ordinary skill in the art could adapt the timing and/or frequency of such signals to a desired application. For example, in FIG. 4B, both control signals 335 and 345 have the same period and toggle simultaneously at point 470, but those characteristics are only for illustration and do not limit the embodiments described herein.

Under no acceleration with the first resonator 312 driven at 70,000 Hz and the second resonator 322 driven at 71,100 Hz in the first half cycle 471, the count output 413 of the up-down counter 410 is −1100 [70,000−71,100=−1100]. During the second half cycle 472 of control 2 signal 345, when the first resonator 312 driven at 70,000 Hz and the second resonator 322 driven at 70,900, the count output 413 of the up-down counter 410 is −900 [70,000−70,900=−900]. The low pass filter 421 then produces an averaged base-band signal output of −1000 over full cycle period. This base-band signal information is then calibrated with calibration routine 423 to give acceleration data output 424 of 0 (zero) [i.e., average of −1000 from up-down counter 410 over the full cycle, +1000 from calibration routine 423=0], indicating zero acceleration. The adjusting of the output 422 of the filter 421, as part of assessing changes in an oscillation frequency of the first oscillating member relative to an oscillation frequency of the second oscillating member, may be described, in this embodiment, as subtracting an offset value from that data, which represents the frequency difference between the oscillation frequency of the first oscillating member and the oscillation frequency of the second oscillating member.

A 1 gee acceleration in the +X direction causes the oscillation frequency of resonator 312 to increase from 70,000 Hz to 70,010 Hz, while the oscillation frequency of resonator 322 decreases from 71,100 Hz to 71,090 Hz during the first cycle. Consequently, during the first half cycle, the count output 413 of the up-down counter 410 is −1080 [70,010−71,090=−1080]. During the second half cycle under +1 gee acceleration, resonator 322 decreases from 70,900 Hz to 70,890 Hz during the first cycle. Therefore, the count output 413 during the second half cycle of the up-down counter 410 is −880 [70,010−70,890=−880]. The low pass filter 421 then produces an averaged base-band signal output of −980 (i.e., average of −1080 and -880) over full cycle period. This base-band signal information is then calibrated with calibration routine 423 to give acceleration data output 424 of +20 [i.e., average of −980 from up-down counter 410 over the full cycle, +1000 from calibration routine 423=+20] indicating +1 gee of +X acceleration.

A 1 gee acceleration in the −X direction causes the oscillation frequency of resonator 312 to decrease from 70,000 Hz to 69,990 Hz, while the oscillation frequency of resonator 322 increases from 71,100 Hz to 71,110 Hz during the first cycle. Consequently, during the first half cycle, the count output 413 of the up-down counter 410 is −1120 [69,990−71,110=−1120]. During the second half cycle under −1 gee acceleration, resonator 322 increases from 70,900 Hz to 70,910. Therefore, the count output 413 during the second half cycle 472 of the up-down counter 410 is −920 [69,990−70,910=−920]. The low pass filter 421 then produces an averaged base-band signal output of −1020 (i.e., average of −1120 and -920) over full cycle period. This base-band signal information is then calibrated with calibration routine 423 to give acceleration data output 424 of −20 [i.e., average of −1020 from up-down counter 410 over the full cycle, +1000 from calibration routine 423=−20] indicating −1 gee of −X acceleration.

Toggle Example 3 [0:0 to 1:0] [69,900 Hz:71,000 Hz to 70,100:71,000 Hz]

A similar analysis as described before can be done for the case in which drive frequency of resonator 312 is toggled between 69,900 Hz and 70,100 Hz, but the drive frequency of resonator 322 (in this example, 71,000 Hz) is not toggled at all (or is toggled at some later time), to give sign and magnitude of the acceleration signal.

In summary, in the embodiments above where the resonators 312 and 322 are each oscillated two different frequencies in response to the control signals 335 and 345, respectively, the frequencies of the resonators 312 and 322 may be described according to the following tables (Table 1A and Table 1B):

TABLE 1A

| Control [335:345] | Resonator 312 under 0 acceleration | Resonator 312 under 1 gee +X axis acceleration (+10 Hz change) | Resonator 312 under 1 gee −X axis acceleration (−10 Hz change) |
| --- | --- | --- | --- |
| [0:0] no toggle | constant 70,000 Hz | constant 70,010 Hz | constant 69,990 Hz |
| [0:0] to [0:1] | constant 70,000 Hz | constant 70,010 Hz | constant 69,990 Hz |
| [0:0] to [1:0] | toggle +/− 100 Hz between 69,900 Hz and 70,100 Hz | toggle +/− 100 Hz between 69,910 Hz and 70,110 Hz | toggle +/− 100 Hz between 69,890 Hz and 70,090 Hz |

TABLE 1A-continued

| Control [335:345] | Resonator 312 under 0 acceleration | Resonator 312 under 1 gee +X axis acceleration (+10 Hz change) | Resonator 312 under 1 gee −X axis acceleration (−10 Hz change) |
|---|---|---|---|
| [0:0] to [1:1] | toggle +/− 100 Hz between 69,900 Hz and 70,100 Hz | toggle +/− 100 Hz between 69,910 Hz and 70,110 Hz | toggle +/− 100 Hz between 69,890 Hz and 70,090 Hz |

TABLE 1B

| Control [335:3451] | Resonator 322 under 0 acceleration | Resonator 322 under 1 gee +X axis acceleration (−10 Hz change) | Resonator 322 under 1 gee −X axis acceleration (+10 Hz change) |
|---|---|---|---|
| [0:0] no toggle | constant 71,000 Hz | constant 70,990 Hz | constant 71,010 Hz |
| [0:0] to [0:1] | toggle +/− 100 Hz between 70,900 Hz and 71,100 Hz | toggle +/− 100 Hz between 70,890 Hz and 71,090 Hz | toggle +/− 100 Hz between 70,910 Hz and 71,110 Hz |
| [0:0] to [1:0] | constant 71,000 Hz | constant 70,990 Hz | constant 71,010 Hz |
| [0:0] to [1:1] | toggle +/− 100 Hz between 70,900 Hz and 71,100 Hz | toggle +/− 100 Hz between 70,890 Hz and 71,090 Hz | toggle +/− 100 Hz between 70,910 Hz and 71,110 Hz |

For different toggle conditions, the signal chain can be summarized according to following (Table 2):

Under 0 acceleration:

| Control [335:345] | Resonator 312, first half cycle of control signal 335 | Resonator 312, second half cycle of control signal 335 | Resonator 322, first half cycle of control signal 345 | Resonator 322, second half cycle of control signal 345 | Filtered output 422 | Acceleration signal 424 |
|---|---|---|---|---|---|---|
| [0:0] no toggle | 70,000 | 70,000 | 71,000 | 71,000 | −1,000 | 0 |
| [0:0] to [0:1] | 70,000 | 70,000 | 70,900 | 71,100 | −1,000 | 0 |
| [0:0] to [1:0] | 69,900 | 70,100 | 71,000 | 71,000 | −1,000 | 0 |
| [0:0] to [1:1] | 69,900 | 70,100 | 70,900 | 71,100 | −1,000 | 0 |

Under 1 gee acceleration in +X axis:

| Control [335:345] | Resonator 312, first half cycle of control signal 335 | Resonator 312, second half cycle of control signal 335 | Resonator 322, first half cycle of control signal 345 | Resonator 322, second half cycle of control signal 345 | Filtered output 422 | Acceleration signal 424 |
|---|---|---|---|---|---|---|
| [0:0] no toggle | 70,010 | 70,010 | 70,990 | 70,990 | −980 | 20 |
| [0:0] to [0:1] | 70,010 | 70,010 | 70,890 | 71,090 | −980 | 20 |
| [0:0] to [1:0] | 69,910 | 70,110 | 70,990 | 70,990 | −980 | 20 |
| [0:0] to [1:1] | 69,910 | 70,110 | 70,890 | 71,090 | −980 | 20 |

Under 1 gee acceleration in −X axis:

| Control [335:345] | Resonator 312, first half cycle of control signal 335 | Resonator 312, second half cycle of control signal 335 | Resonator 322, first half cycle of control signal 345 | Resonator 322, second half cycle of control signal 345 | Filtered output 422 | Acceleration signal 424 |
|---|---|---|---|---|---|---|
| [0:0] no toggle | 69,990 | 69,990 | 71,010 | 71,010 | −1,020 | −20 |
| [0:0] to [0:1] | 69,990 | 69,990 | 70,910 | 71,110 | −1,020 | −20 |
| [0:0] to [1:0] | 69,890 | 70,090 | 71,010 | 71,010 | −1,020 | −20 |
| [0:0] to [1:1] | 69,890 | 70,090 | 70,910 | 71,110 | −1,020 | −20 |

While the examples above include two oscillators, each toggled among two drive frequencies, other embodiments may have toggle one or more resonators 312 among more than two frequencies, and/or at different phases. Toggling among additional frequencies causes up-down counter 410 to produce a count output 413, which has multiple frequency components, but, because acceleration signal is in the baseband (or near 0 frequency), the signal can be low pass filtered with a system or circuit to reproduce acceleration magnitude and sign.

Although the examples above have analyzed oscillator drive signals, other embodiments analyze PLL feedback signals, which change frequencies along with the drive signals. The analyses can also be done on PLL output 332 and 342 to achieve higher resolution. The operation of analyzer circuit 400 would proceed as described above for the drive signals.

Self-Test

Toggling drive frequencies provides an opportunity for self-testing a multi-oscillator system. A system for implementing a self-test is schematically illustrated in FIG. 4A and FIG. 4B, and operates on the count output 413 of up-down counter 410.

If the system 300 is not malfunctioning as drive frequencies are toggled, then the difference between the oscillations frequencies of the resonators 312 and 322 should remain constant in some embodiments. In contrast, a change in the difference between those oscillation frequencies may indicate malfunction of one or more parts of the system 300. Consequently, such a system may be tested by driving a first member 312 with a first member drive signal, and toggling the first member drive signal between a first frequency and a second frequency, and driving a second member 322 with a second member drive signal, and toggling the second member drive signal between a third frequency and a fourth frequency, and then assessing the operation of the system by comparing oscillations of the first member 312 and the second member 322.

Figure 6:
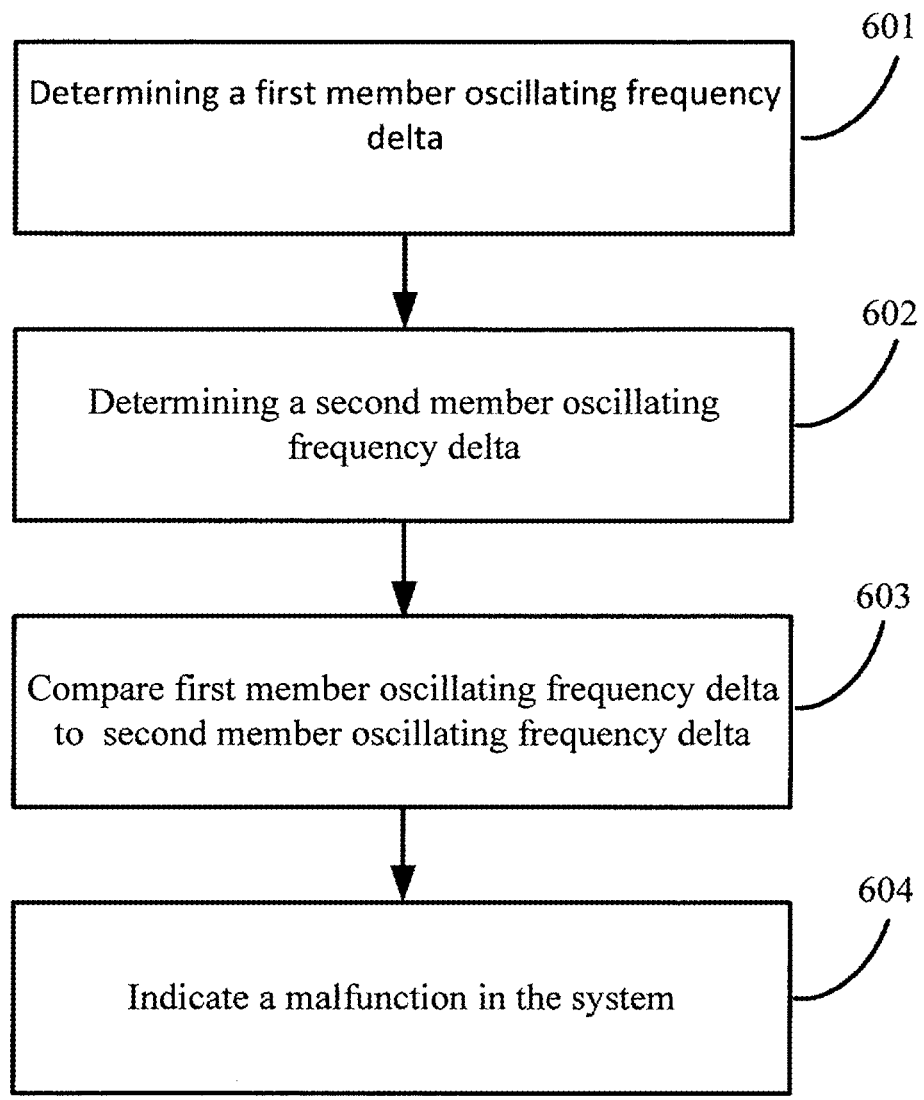
FIG. 6 is a flow chart of an embodiment of a method of self-test.

More specifically, as described below and schematically illustrated by the flow chart in FIG. 6, comparing oscillations of the first member 312 and the second member 322 may include determining a first member oscillating frequency delta (step 601), the first member oscillating frequency delta being the difference between frequencies of oscillation of the first member driven at the first frequency and the second frequency, and determining a second member oscillating frequency delta (step 602), the second member oscillating frequency delta being the difference between frequencies of oscillation of the second member driven at the third frequency and the fourth frequency; and comparing the first member oscillating frequency delta and the second member oscillating frequency delta (step 601).

For example, consider an embodiment in which resonator 312 is driven initially at 69,900 Hz, and then is toggled to 70,100 Hz (an increase of 200 Hz), and in which resonator 322 is driven initially at 70,900 Hz, and then is toggled to 71,100 Hz (an increase of 200 Hz). In this example, each drive frequency is increased by 200 Hz, although other frequency changes may be used in other embodiments. This 200 Hz delta frequency information is available in frequency domain at the count output 413 at the toggle frequency of control 1 signal 335 for resonator 312 and at the toggle frequency of control 2 signal 345 for resonator 322, respectively.

The count output 413 of counter 410 is processed by circuit 430, beginning with demodulator 431 (which, in some embodiments, maybe a band-pass filter), which also receives update signal (update_ST1) 436 as sample rate trigger which may be switching at the same frequency as control 1 signal 335. Demodulator 431 produces a self-test base band output 432 of the difference (200 Hz) between the pre-toggle frequency (69,900 Hz) and the post-toggle frequency (70,100 Hz) of the signal 334 that drives the first resonator 312. This signal 432 then goes to low pass filter 433 to give a filtered self-test output 434 with an update rate determined by update signal (update_ST2) 437. A calibration circuit (or routine executed, for example, in a processor) for self-test 435 may be used to cancel any as-born errors due to imperfections or for calibration over temperature to give a calibrated self-test signal output 438. This filtered and calibrated self-test output 438 can then be represented with a memory or register 451.

Similarly, the self-test circuit 440 for the second resonator 322 can be implemented which can be running at different control 2 toggle 345 frequency than the frequency of control 1 toggle 335. The count output 413 signal is then filtered and filtered to give an indication of magnitude and sign of frequency toggle for resonator 322, as represented by memory or register 453. Self-test circuit 440 operates on count output 413 in the same manner as self-test circuit 430, and includes demodulator 441 (which, in some embodiments, may be a band pass filter), driven by update signal (update_ST3) 446 to produce self-test base-band output 442, and low pass filter 443 driven by update signal (update ST_4) 447 to produce low pass filtered signal 444. A calibration circuit (or routine executed, for example, in a processor) for self-test 445 may be used to cancel any as-born errors due to imperfections or for calibration over temperature to give a calibrated self-test signal output 448.

The filters shown in 400 (i.e., 421; 431; 433; 441; 443) are very common and widely used, as known in the art, and a person of ordinary skill in the art would understand their use and implementation in the embodiments disclosed herein. One common way of implementing a filter architecture is to use a Hogenhauer architecture described by Eugene Hogenhauer in "An Economical Class of Digital Filters for Decimation and Interpolation," IEEE Transactions on Acoustics, Speech, and Signal Processing, Vol. ASSP-29, No. 2, April 1981. Many serial or parallel branches of this filter structure can be formed to gather particular frequency-band-specific data over one or many frequency bands. This filter technique is one of many that can be used to reproduce the self-test or acceleration information with help of digital or analog circuits.

The final self-test data 438 (and/or 448, or average of both) may then be compared (step 603) to each other and/or to an expected value of 458 (e.g. via comparator 459), which value 458 may also be stored in memory 457. For example, it may be known a priori that the value 458 of the frequency difference in a properly-functioning system is 400 Hz, given the frequencies and toggling described above. Comparing the actual sum 456, from self-test adder 455, against an expected value 458 in comparator 459 indicates a malfunction of the system 300 if the sum 456 does not match the value 458. In some embodiments, the analyzer 400 may produce a signal 460 (step 604), which may be a warning signal indicating a malfunction, and/or a control signal terminating operation of the system 300.

Figure 7:
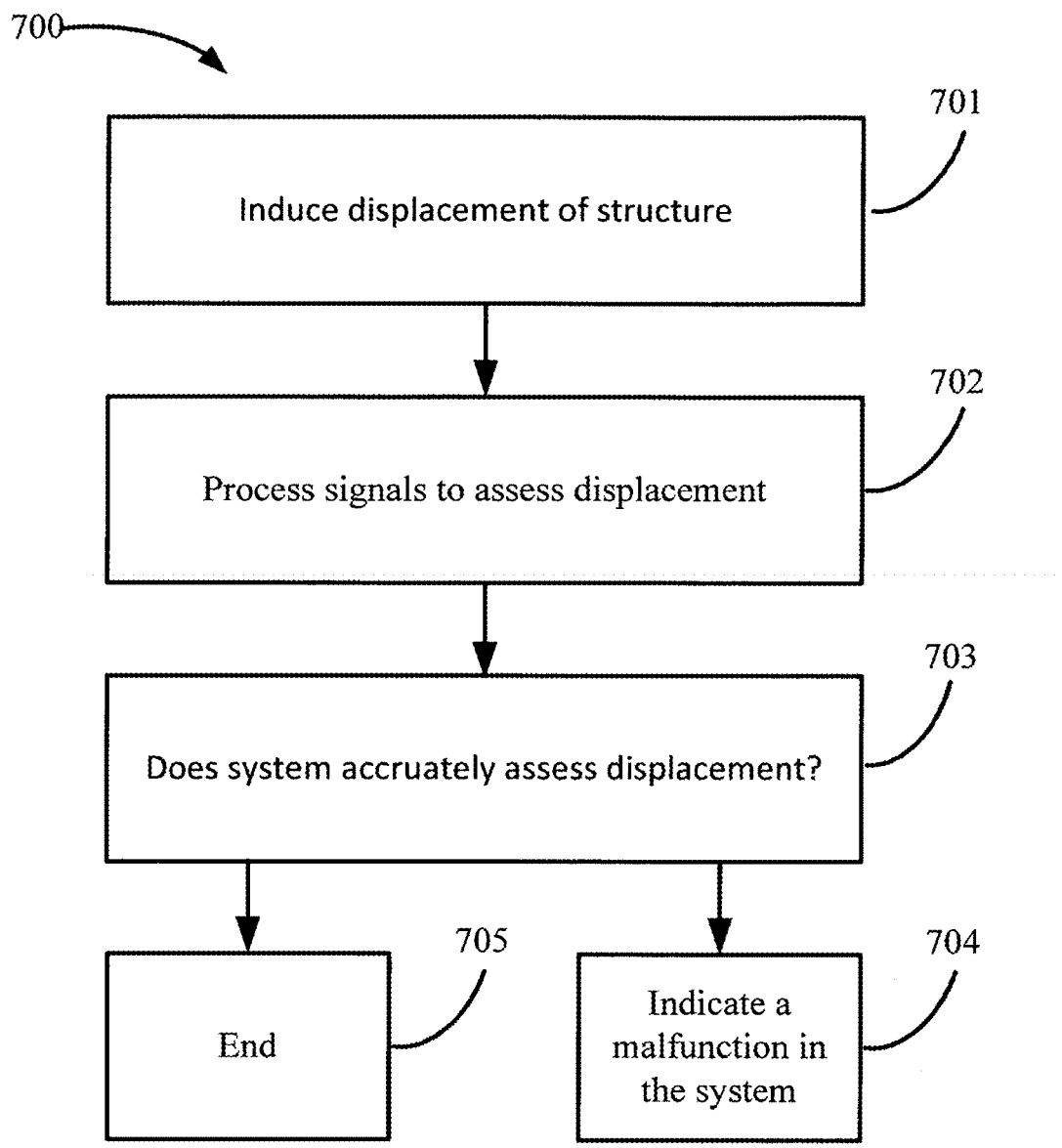
FIG. 7 is a flow chart of alternate embodiments of methods of self-test.

The method described above uses phase toggling in the resonator feedback path as one of the stimuli to produce a "known" frequency shift in the resonator. Other embodiments achieve in-situ self-test by changing the voltage across tuning capacitors (e.g., 130 and 160) of the resonators 312(110 and 140, respectively) in a predetermined way to modulate the individual resonator frequencies. Such embodiment may be described in connection with the method 700 illustrated by flow chart of FIG. 7, which begins by artificially inducing displacement of a structure of a system 100 at step 701. The amount of the induced displacement may be controlled by, among other things, the amplitude and polarity of a drive signal that inducement, and the controlled displacement may be referred-to as a "known" (or "defined" or "pre-defined") displacement.

Figure 1F:
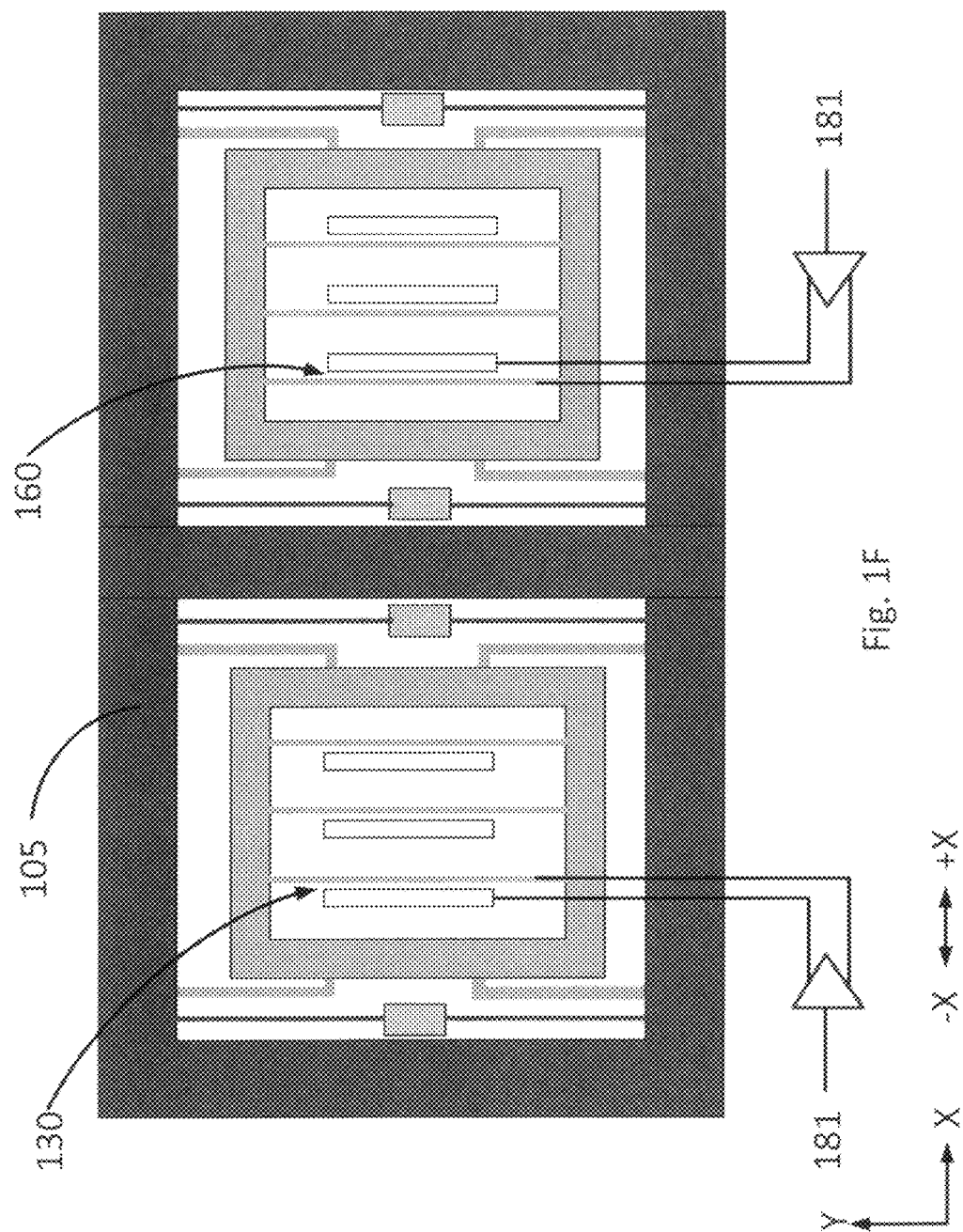
FIG. 1F schematically illustrates an embodiment of circuitry for implementing self-test.

For example, a self-test drive signal 181 from controller 370 may provide a voltage across one or both of tuning capacitors 130 and 160, as schematically illustrated in FIG. 1F. Either or both of tuning capacitors 130 and 160 therefore applies electrostatic force to its respective oscillator (110 and 140, respectively) to induce displacement of those resonators 312 in the +X or −X direction along the X-axis. Such displacement may be equal to a displacement caused by known amount of acceleration, for example, but may be produced in the absence of acceleration.

Yet other embodiments drive the motion of the frame 105 in a predetermined way to cause frequency change in the resonators 312110, 140 resonators by driving one or both of frame tuning electrodes 185 and 186 with a self-test drive signal 181, as schematically illustrated in FIG. 1G. Either or both of frame tuning electrodes 185 and 186 therefore applies electrostatic force to the frame 105, to induce displacement of the frame 105 in the +X or −X direction along the X-axis.

At step 702, the system processes signals as described herein, as if the induced displacement were caused by acceleration. At step 703, the system 100 assesses the output of the system 100 (e.g., acceleration signal 424) to determine whether the acceleration indicated by that signal 424 is equal to the known amount of acceleration (i.e., the expected acceleration signal). If so, the self-test ends (step 705), and if not, the method 700 indicates a malfunction as step 704.

Methods of Operation

Figure 5:
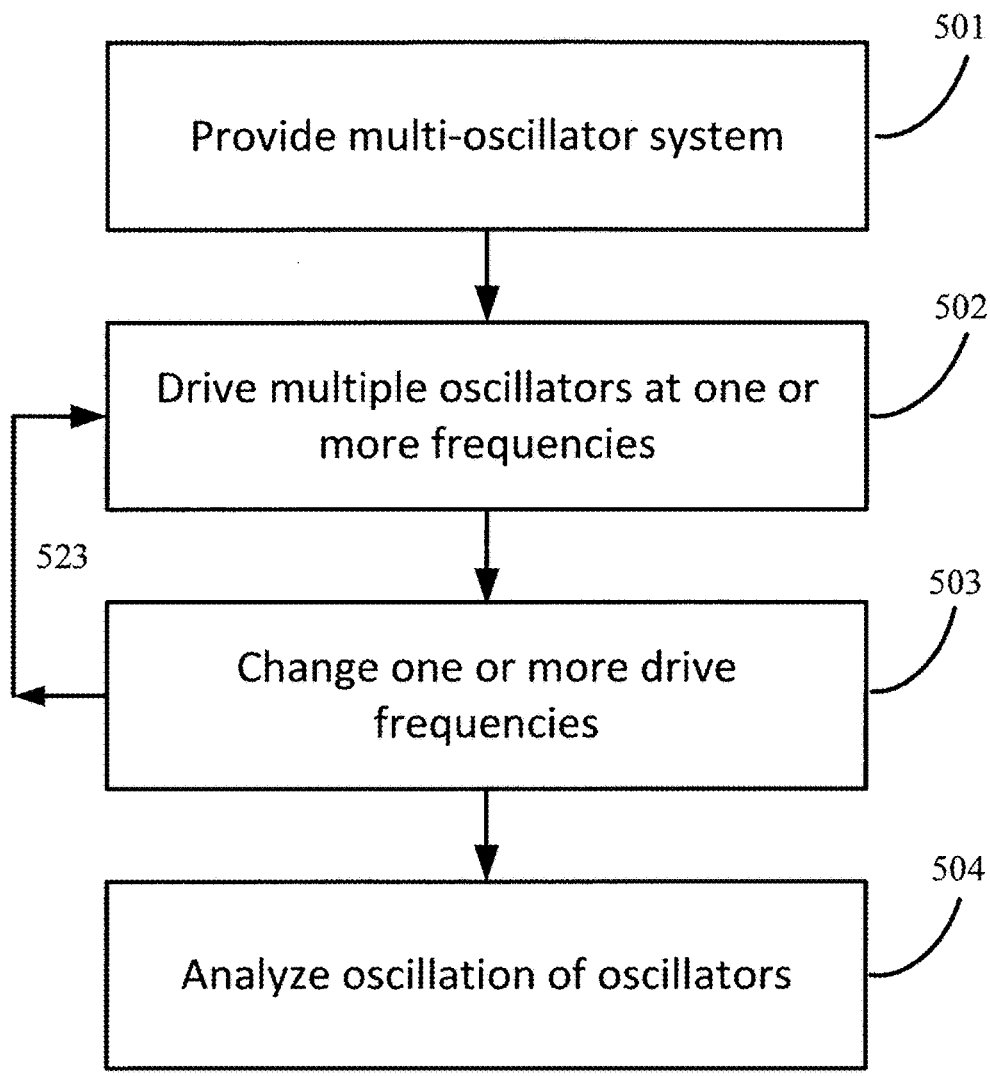
FIG. 5 is a flow chart of a method of operating a multi-oscillator system.

FIG. 5 is a flow chart describing methods of operation of various systems described herein. Step 501 includes providing a multi-oscillator system. Such a system may include two oscillators, such as in system 100 for example, or other arrangements of two or more oscillators. In general, the resonators 312 of a multi-oscillator system are configured to responds differently in response to a stimulus applied to each of the oscillators. An accelerometer, for example, as described above is but one example.

At step 502, each of the resonators 312 is driven at one or more frequencies. For example, each oscillator in a multi-oscillator system may initially be driven at a frequency distinct from the drive frequencies of other resonators 312 in the multi-oscillator system, although one or more of such resonators 312 may, at least initially, be driven at identical frequencies.

Then, as step 503, at least one of the drive frequencies is toggled to a different frequency. In some embodiments, toggling at least one of the drive frequencies includes changing at least one of the drive frequencies to a frequency that is not identical to a frequency at which another oscillator is driven, for example so as to reduce the risk of frequency lock among the oscillators.

Some embodiments toggle more than one of the drive frequencies synchronously. Some embodiments that toggle drive frequencies synchronously toggle the drive frequencies simultaneously, while in other embodiments toggle the drive frequencies non-simultaneously, but at times have a fixed relationship. Some embodiments toggle drive frequencies a synchronously. The toggling of drive frequencies continues, as indicated by the loop 523 back from step 503 to step 502 in FIG. 5.

At step 504, the method of FIG. 5 analyzes the oscillations of the resonators 312 of the multi-oscillator system. In some embodiments, the oscillations are analyzed to determine a change in those oscillations, such as in an accelerometer as described above, to name but one example. In some embodiments, the oscillations are analyzed to detect malfunction of the multi-oscillatory system, such as by detecting unexpected changes in oscillation frequencies as described above, to name but one example.

FIG. 6 is a flow chart describing analysis of oscillations of the resonators 312 of the multi-oscillator system (and may be considered as an embodiment of step 504 from FIG. 5) for self-test, as described in self-test operation.

Various embodiments of the present invention may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

P1: A method of self-testing a multi-oscillator system, including driving a first oscillating member with a first member variable frequency drive signal, and toggling the first variable frequency drive signal between a first frequency and a second frequency, at least one of the first frequency and the second frequency offset from the first oscillating member's resonant frequency;

driving a second oscillating member with a second member variable frequency drive signal, and toggling the second variable frequency drive signal between a third frequency and a fourth frequency, determining a first member oscillation differential in the first oscillating member's oscillation frequency when driven at the first frequency and then at the second frequency;

determining a second member oscillation differential in the second oscillating member's oscillation frequency when driven at the third frequency and then at the fourth frequency;

summing the first member oscillation differential with the second member oscillation differential to produce a test sum; and comparing the test sum to a reference sum.

P2: The method of self-testing a multi-oscillator system according to P1, further includes sending an alert signal if the test sum does not equal the reference sum.

P11: A system for self-testing a multi-oscillator system, including:

a first oscillation member suspended from a substrate and having a first resonant frequency;

a second oscillation member suspended from a substrate and having a second resonant frequency;

a first variable-frequency driver configured to selectively drive the first oscillation member with a first member variable frequency drive signal, and to controllably toggle the first variable frequency drive signal between a first frequency and a second frequency;

a second variable-frequency driver configured to selectively drive the second oscillation member with a second variable frequency drive signal, and to controllably toggle the second variable frequency drive signal between a third frequency and a fourth frequency;

a self-test analyzer circuit comprising:

a first filter configured to determine a first member oscillation differential in the first oscillating member's oscillation frequency when driven at the first frequency and then at the second frequency;

a second filter configured to determine a second member oscillation differential in the second oscillating member's oscillation frequency when driven at the third frequency and then at the fourth frequency;

an adder to add the first member oscillation differential with the second member oscillation differential to produce a test sum; and a comparator to compare the test sum to a reference sum.

P12: The system for self-testing a multi-oscillator system of P11, wherein the comparator is configured to send an alert signal if the test sum does not equal the reference sum.

P21: A system for detecting acceleration, comprising:

a first oscillation member;

a second oscillation member;

a first variable-frequency driver means configured to selectively drive the first oscillation member with a first member variable frequency drive signal, and to controllably toggle the first variable frequency drive signal between a first frequency and a second frequency;

a second driver means configured to drive the second oscillation member at a second member drive frequency;

an oscillation analyzer means configured to detect changes in oscillations of the first oscillation member and the second oscillation member in response to acceleration of the system.

P31. A method of operating an accelerometer having a plurality of resonating members, each resonating member having resonant frequency, the method comprising:

driving a first resonating member with a first member drive signal, and toggling the first member drive signal between a first frequency and a second frequency;

driving a second resonating member at a second member drive frequency; and detecting acceleration of the accelerometer by assessing changes in oscillation frequencies of at least one of the first resonating member and the second resonating member.

P32. The method of operating an accelerometer of P31, wherein assessing changes in oscillation frequencies of the first resonating member and the second resonating member comprises assessing changes in an oscillation frequency of the first resonating member relative to an oscillation frequency of the second resonating member.

P33. The method of operating an accelerometer of P31, wherein driving the second resonating member at a second member drive frequency comprises driving the second resonating member with a second variable frequency drive signal, and toggling the second variable frequency drive signal between a third frequency and a fourth frequency.

P34. The method of operating an accelerometer of 1, wherein driving a first resonating member with a first variable frequency drive signal, and toggling the first variable frequency drive signal between a first frequency and a second frequency, comprises driving the first resonating member with a first phase-locked loop.

P35. The method of operating an accelerometer of P34, wherein toggling the first variable frequency drive signal between a first frequency and a second frequency comprises changing a phase offset introduced into a drive signal produced by the first phase-locked loop at a point between the phase-locked loop and the first resonating member.

P36. The method of operating an accelerometer of P34, wherein:

the first phase-locked loop comprises a phase divider, the phase divider producing a plurality of signals, each of the plurality of signals having a non-zero phase relative to other of the plurality of signals; and the accelerometer includes a multiplexer configured to controllably couple one of the plurality of signals to the first resonating member as the drive signal; and wherein changing a phase offset introduced into the drive signal comprises operating the multiplexer to couple a different one of the plurality of signals to the first resonating member.

P41. A system for detecting acceleration, comprising:

a first oscillation member suspended from a substrate and having a first resonant frequency;

a second oscillation member suspended from a substrate and having a second resonant frequency;

a first variable-frequency driver configured to drive the first oscillation member with a first member variable frequency drive signal, and to controllably toggle the first variable frequency drive signal between a first frequency and a second frequency;

a second driver configured to drive the second oscillation member at a second member drive frequency;

an oscillation analyzer configured to detect changes in oscillations of the first oscillation member and the second oscillation member in response to acceleration of the system.

P42. The system of P41, wherein the first variable-frequency driver is configured to cycle among the first frequency and the second frequency.

P43. The system of P41, wherein the second driver comprises a second variable-frequency driver configured to drive the second oscillation member with a second variable frequency drive signal, and to controllably toggle the second variable frequency drive signal between a third frequency and a fourth frequency.

P44. The system of P41, wherein the oscillation analyzer comprises:
a first counter coupled to the first member variable frequency drive signal to produce a first frequency count;
a second counter coupled to the second member variable frequency drive signal to produce a second frequency count;
a first subtractor configured to offset the first frequency count with the second frequency count to produce a frequency difference count.

P45. The system of P41, wherein:
the first variable-frequency driver comprises a first phase-locked loop, the first phase-locked loop comprising:
a phase divider configured to produce a plurality of phase-shifted signals, and
a multiplexor configured to controllably couple one of the plurality of signals to the first oscillation member as the first drive signal.

P46. The system of P45, wherein the first phase-locked loop is configured to controllably couple one, and then a different one, of the plurality of phase-shifted signals to the first oscillator as the first member variable frequency drive signal to toggle the first member variable frequency drive signal between a first frequency and a second frequency.

P47. The system of P43, wherein:
the first variable-frequency driver comprises a first phase-locked loop having:
a first phase divider configured to produce a first plurality of phase-shifted signals, and
a first multiplexor controlled by the first control signal to controllably couple one of the first plurality of signals to the first oscillation member as the first drive signal, the first control signal coupled to the first multiplexor; and
the second driver comprises:
a second phase divider configured to produce a second plurality of phase-shifted signals, and
a second multiplexor controlled by the second control signal to controllably couple one of the second plurality of signals to the second oscillation member as the second drive signal, the second control signal coupled to the second multiplexor.

Various embodiments of the invention may be implemented at least in part in any conventional computer programming language. For example, some embodiments may be implemented in a procedural programming language (e.g., "C"), or in an object oriented programming language (e.g., "C++"). Other embodiments of the invention may be implemented as preprogrammed hardware elements (e.g., application specific integrated circuits, FPGAs, and digital signal processors), or other related components.

In an alternative embodiment, the disclosed apparatus and methods may be implemented as a computer program product for use with a computer system. Such implementation may include a series of computer instructions fixed either on a tangible medium, such as a non-transient computer readable medium (e.g., a diskette, CD-ROM, ROM, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method of detecting a physical quantity from a sensor, the sensor having a plurality of oscillation members including at least a first oscillation member and a second oscillation member, the method comprising:
driving the first oscillation member with a first drive signal having a first drive frequency in a first time interval and a second drive frequency in a second time interval;
driving the second oscillation member with a second drive signal;
receiving a first incoming signal representing an oscillation frequency of the first oscillation member;
receiving a second incoming signal representing an oscillation frequency of the second oscillation member; and
detecting the physical quantity based on the oscillation frequency of the first oscillation member and the oscillation frequency of the second oscillation member.

2. The method according to claim 1, wherein the first incoming signal is obtained by passing an output of the first oscillation member through a first phase-locked loop and/or a first phase divider, and wherein the second incoming signal is obtained by passing an output of the second oscillation member through a second phase-locked loop and/or a second phase divider.

3. The method according to claim 1, wherein the first drive frequency and the second drive frequency are different than a natural resonant frequency of the first oscillation member.

4. The method according to claim 1, wherein the second drive signal has a third drive frequency in the first time interval and a fourth drive frequency in the second time interval.

5. The method according to claim 1, wherein detecting the physical quantity comprises detecting an acceleration.

6. The method of claim 1, wherein the first time interval and the second time interval are contiguous and have durations that are less than a frequency locking period between the first oscillation member and the second oscillation member.

7. A system for detecting a physical quantity, comprising:
an oscillation analyzer configured to:
drive a first oscillation member with a first drive signal having a first drive frequency in a first time interval and a second drive frequency in a second time interval;
drive a second oscillation member with a second drive signal;
receive a first incoming signal representing an oscillation frequency of the first oscillation member;
receive a second incoming signal representing an oscillation frequency of the second oscillation member; and
detect the physical quantity based on the oscillation frequency of the first oscillation member and the oscillation frequency of the second oscillation member.

8. The system of claim 7, wherein the oscillation analyzer is configured to receive the first incoming signal at least in part by receiving an output of a first phase-locked loop coupled to the first oscillation member, and wherein the oscillation analyzer is configured to receive the second incoming signal at least in part by receiving an output of a second phase-locked loop coupled to the second oscillation member.

9. The system of claim 8, wherein the first drive frequency and the second drive frequency are different than a natural resonant frequency of the first oscillation member.

10. The system of claim 7, wherein the oscillation analyzer is configured to receive the first incoming signal at least in part by receiving an output of a first phase divider coupled to the first oscillation member and wherein the oscillation analyzer is configured to receive the second incoming signal at least in part by receiving an output of a second phase divider coupled to the second oscillation member.

11. The system of claim 7, wherein the oscillation analyzer comprises:
a first counter configured to produce a first frequency count based on the first incoming signal;
a second counter configured to produce a second frequency count based on the second incoming signal; and
a first subtractor configured to subtract the first frequency count from the second frequency count to produce a frequency difference count.

12. The system of claim 7, wherein the second drive signal has a third drive frequency in the first time interval and a fourth drive frequency in the second time interval.

13. The system of claim 12, wherein the third drive frequency and the fourth drive frequency are different than a natural resonant frequency of the second oscillation member.

14. The system of claim 7, wherein the first time interval and the second time interval are contiguous and have durations that are less than a frequency locking period between the first oscillation member and the second oscillation member.

15. A method of testing a system having a plurality of movable members, the method comprising:
driving a first member with a first member drive signal, and toggling the first member drive signal between a first drive frequency and a second drive frequency;
driving a second member with a second member drive signal, and toggling the second member drive signal between a third drive frequency and a fourth drive frequency; and
determining whether the first and second members are oscillating at target frequencies.

16. The method of testing a system of claim 15, wherein determining whether the first and second members are oscillating at target frequencies comprises:
determining a first member oscillating frequency delta based on a difference between a frequency of oscillation of the first member when driven at the first drive frequency and a frequency of oscillation of the first member when driven at the second drive frequency;
determining a second member oscillating frequency delta based on a difference between a frequency of oscillation of the second member when driven at the third drive frequency and a frequency of oscillation of the second member when driven at the fourth frequency; and
comparing the first member oscillating frequency delta and the second member oscillating frequency delta.

17. The method of testing a system of claim 16, wherein determining a first member oscillating frequency delta comprises:
filtering a signal representing a difference in oscillation frequency between the first member and the second member to produce first member self-test data and second member self-test data;
comparing the first member self-test data and second member self-test data to a target value; and
indicating a malfunction in the system if comparison is not equal to the target value.

18. The method of testing a system of claim 16, further comprising at least one of: terminating operation of the system if a malfunction is indicated; or inducing a known displacement of at least one of the plurality of movable members and assessing whether the system produces an output accurately reporting an acceleration equal to an acceleration that would cause the known displacement of the at least one of the plurality of movable members.

19. The method of testing a system of claim 15, wherein the first and second movable members comprise at least one of an oscillator or a frame.

20. A method of operating a sensor for detecting acceleration, the sensor having a plurality of oscillation members including at least a first oscillation member and a second oscillation member, the method comprising:
driving the first oscillation member with a first drive signal having a first drive frequency in a first time interval and a second drive frequency in a second time interval;
driving the second oscillation member with a second drive signal;
receiving a first incoming signal representing an oscillation frequency of the first oscillation member;
receiving a second incoming signal representing an oscillation frequency of the second oscillation member; and
detecting the acceleration based on the oscillation frequency of the first oscillation member and the oscillation frequency of the second oscillation member.

21. The method of claim 20, wherein
detecting the acceleration based on the oscillation frequency of the first oscillation member and the oscillation frequency of the second oscillation member comprises detecting a magnitude of the acceleration based on the oscillation frequency of the first oscillation member and the oscillation frequency of the second oscillation member.

22. The method of claim 20, wherein driving the first oscillation member with a first drive signal comprises changing a phase offset introduced into a control signal produced by a first phase-locked loop at a point between the phase-locked loop and the first oscillation member.

23. The method of claim 22, wherein driving the first oscillation member with a first drive signal further comprises producing a plurality of signals having different phases and using one of the plurality of signals to drive the first oscillation member.

24. The method of claim 20, wherein the first drive frequency and the second drive frequency are different than a natural resonant frequency of the first oscillation member.

25. The method of claim 24, wherein driving the first oscillation member with a first drive signal having a first drive frequency in a first time interval and a second drive frequency in a second time interval comprises at least one of:

toggling the first drive signal between the first drive frequency and the second drive frequency at a rate that is too short to allow the oscillation of the first oscillation member to lock to the oscillation of the second oscillation member; or toggling the first drive signal between the first drive frequency and the second drive frequency wherein the first drive frequency is below a natural resonant frequency of the first oscillation member and the second drive frequency is above the natural resonant frequency of the first oscillation member.

26. The method of claim 20, wherein driving the second oscillation member with a second drive signal comprises driving the second oscillation member with a second drive signal having a third drive frequency in the first time interval and a fourth drive frequency in the second time interval.

27. The method of claim 20, wherein the first time interval and the second time interval are contiguous and have durations that are less than a frequency locking period between the first oscillation member and the second oscillation member.

28. A system for detecting acceleration comprising:
an oscillation analyzer configured to:
drive a first oscillation member with a first drive signal having a first drive frequency in a first time interval and a second drive frequency in a second time interval;
drive a second oscillation member with a second drive signal;
receive a first incoming signal representing an oscillation frequency of the first oscillation member;
receive a second incoming signal representing an oscillation frequency of the second oscillation member; and
detect the acceleration based on the oscillation frequency of the first oscillation member and the oscillation frequency of the second oscillation member.

29. The system of claim 28, wherein the first drive frequency and the second drive frequency are different than a natural resonant frequency of the first oscillation member.

30. The system of claim 28, wherein the oscillation analyzer is configured to drive the second oscillation member with a second drive signal having a third drive frequency in the first time interval and a fourth drive frequency in the second time interval.

31. The system of claim 30, wherein the third frequency and the fourth frequency are different than a natural resonant frequency of the second oscillation member.

32. The system of claim 28, wherein the oscillation analyzer comprises a first phase-locked loop configured to produce a plurality of phase-shifted signals, and wherein:
the first phase-locked loop is coupled to a phase divider configured to produce the plurality of phase-shifted signals and further is coupled to a multiplexor configured to controllably couple one of the plurality of phase-shifted signals to the first oscillation member as the first drive signal.

33. The system of claim 28, wherein:
the first time interval and the second time interval are contiguous and have durations that are less than a frequency locking period between
the first oscillation member and
the second oscillation member.

* * * * *